(12) United States Patent
Negishi et al.

(10) Patent No.: US 11,887,960 B2
(45) Date of Patent: Jan. 30, 2024

(54) MEMBER CONNECTION METHOD

(71) Applicant: HITACHI CHEMICAL COMPANY, LTD., Tokyo (JP)

(72) Inventors: Motohiro Negishi, Tokyo (JP); Hideo Nakako, Tokyo (JP); Yuki Kawana, Tokyo (JP); Dai Ishikawa, Tokyo (JP); Chie Sugama, Tokyo (JP); Yoshinori Ejiri, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 156 days.

(21) Appl. No.: 16/757,798

(22) PCT Filed: Oct. 23, 2018

(86) PCT No.: PCT/JP2018/039372
§ 371 (c)(1),
(2) Date: Apr. 21, 2020

(87) PCT Pub. No.: WO2019/082896
PCT Pub. Date: May 2, 2019

(65) Prior Publication Data
US 2021/0351157 A1      Nov. 11, 2021

(30) Foreign Application Priority Data

Oct. 23, 2017    (JP) ................. 2017-204686

(51) Int. Cl.
*H01L 23/00*      (2006.01)
*B22F 7/06*       (2006.01)
(Continued)

(52) U.S. Cl.
CPC ............... *H01L 24/29* (2013.01); *B22F 1/05* (2022.01); *B22F 1/107* (2022.01); *B22F 7/064* (2013.01);
(Continued)

(58) Field of Classification Search
CPC .. H01L 24/83; B22F 7/04; B22F 7/062; B22F 7/064; B22F 7/08; B22F 2007/042; B22F 2007/047; B22F 2301/10
See application file for complete search history.

(56) References Cited

U.S. PATENT DOCUMENTS

2007/0157463 A1    7/2007  Konrath et al.
2008/0196245 A1    8/2008  Nishimura et al.
(Continued)

FOREIGN PATENT DOCUMENTS

CN     103635997 A      3/2014
DE     102011078582 A1  1/2013
(Continued)

OTHER PUBLICATIONS

Bai G, "Low-temperature sintering of nanoscale silver paste for semiconductor device interconnection", Dissertation Submitted to the Faculty of the Virginia Polytechnic Institute and State University in Partial Fulfillment of the Requirement for the Degree of Doctor of Philosophy in Materials Science and Engineering Retrieved from the Internet: URL:http://scholar.lib.vt.edu/theses/available/etd-10312005-163634/, Oct. 2005, XP009166994 (cited in Search Report dated Jul. 12, 2021 in Continuation of NPL Cite No. 1 . . . Supplemental Partial European Search Report Appl. No. EP 18870165).
(Continued)

*Primary Examiner* — Vanessa T. Luk
(74) *Attorney, Agent, or Firm* — FITCH, EVEN, TABIN & FLANNERY, LLP

(57) ABSTRACT

This member connection method includes a printing step. In the printing step, a coating film-formed region in which the coating film is formed, and a coating film non-formed region in which the coating film is not formed are formed in the print pattern, and the coating film-formed region is divided into a plurality of concentric regions and a plurality of radial regions by means of a plurality of line-shaped regions (Continued)

provided so as to connect various points, which are separated apart from one another in the marginal part of the connection region.

5 Claims, 11 Drawing Sheets

(51) Int. Cl.

| | | |
|---|---|---|
| *B22F 7/08* | (2006.01) | |
| *B23K 35/02* | (2006.01) | |
| *B23K 35/30* | (2006.01) | |
| *B22F 1/05* | (2022.01) | |
| *B22F 1/107* | (2022.01) | |
| *B22F 7/04* | (2006.01) | |
| *B22F 1/102* | (2022.01) | |
| *B22F 1/052* | (2022.01) | |

(52) U.S. Cl.
CPC .............. *B22F 7/08* (2013.01); *B23K 35/025* (2013.01); *B23K 35/302* (2013.01); *H01L 24/83* (2013.01); *B22F 1/052* (2022.01); *B22F 1/102* (2022.01); *B22F 2007/047* (2013.01); *B22F 2301/10* (2013.01); *B22F 2304/10* (2013.01); *B22F 2998/10* (2013.01); *H01L 2224/29013* (2013.01); *H01L 2224/29247* (2013.01); *H01L 2224/8384* (2013.01)

(56) References Cited

U.S. PATENT DOCUMENTS

| | | | |
|---|---|---|---|
| 2014/0225274 A1* | 8/2014 | Guyenot | H01L 24/27 |
| | | | 257/774 |
| 2018/0342478 A1* | 11/2018 | Nakako | H01L 24/83 |

FOREIGN PATENT DOCUMENTS

| | | | | |
|---|---|---|---|---|
| EP | 2075835 | A2 | 7/2009 | |
| EP | 3348336 | A1 | 7/2018 | |
| JP | S56-065598 | A | 6/1981 | |
| JP | 07111275 | A * | 4/1995 | .......... H01L 24/743 |
| JP | H7-111275 | A | 4/1995 | |
| JP | 2000-022313 | A | 1/2000 | |
| JP | 2005-203557 | A | 7/2005 | |
| JP | 2007-509495 | A | 4/2007 | |
| JP | 2007-330980 | | 12/2007 | |
| JP | 2008-244242 | A | 10/2008 | |
| WO | 2014/046840 | A1 | 3/2014 | |
| WO | 2017/043540 | A1 | 3/2017 | |
| WO | WO-2017043540 | A1 * | 3/2017 | ................ B22F 1/00 |

OTHER PUBLICATIONS

Zhang ZH, "Processing and Charactenzation of Micro-scale and Nanscale Silver Paste for Power Semiconductor Device Attachment", Dissertation Submitted To the Faculty of the Virginia Polytechnic Institute and State University in Partial Fulfillment of the Requirements for the Degree of Doctor of Philosophy in Electrical Engineering Retrieved from the Internet: URL:http://scholar.lib.vt.edu/theses/available/etd-09082005-231429/unrestricted/Dissertation_Zhiye_Zhang.pdf , Sep. 2005, XP055120437 Continuation of NPL Cite No. 2 . . . cited in Supplemental Partial European Search Report Appl. No. EP 18870165.

Mertens CH, "Die Niedertemperatur-Verbindungstechnik der Leistungselektronik", Fortschritt-Berichte VDI: Reihe 21, Elektrotechnik, No. 365, 2004 (Cited in Office Action dated Jan. 26, 2022 in counterpart EP Patent Application No. 18870165.0).

Office Action dated Jan. 26, 2022 in counterpart EP Patent Application No. 18870165.0 (serving as concise explanation of relevance of Mertens CH, "Die Niedertemperatur-Verbindungstechnik der Leistungselektronik", Fortschritt-Berichte VDI: Reihe 21, Elektrotechnik, No. 365, 2004.

Hitachi Chemical Company, "Document submitted for certification of exception to loss of novelty", Nov. 5, 2017.

* cited by examiner

Fig.3
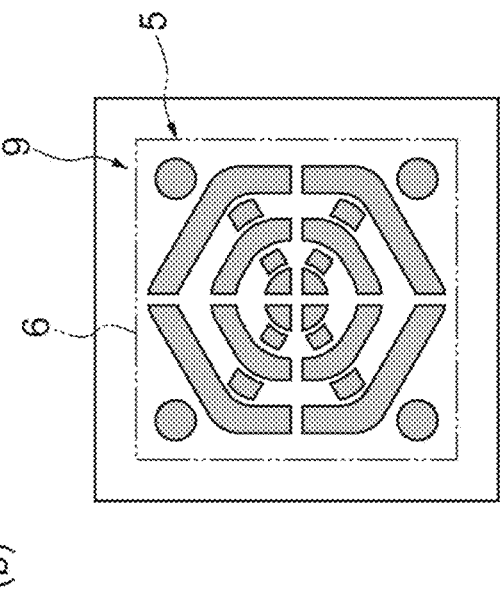
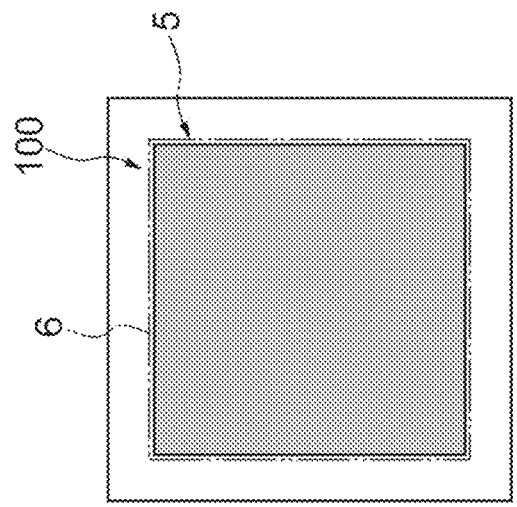

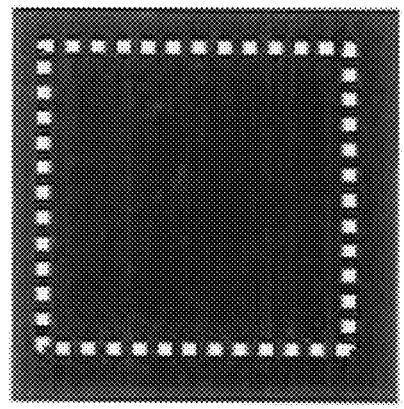
(b)
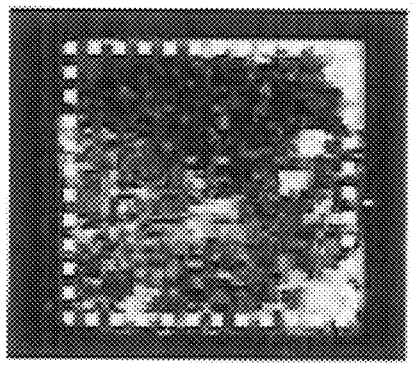
(a)
Fig.4

MEMBER CONNECTION METHOD

CROSS-REFERENCE TO RELATED APPLICATIONS

This application is a U.S. national phase application filed under 35 U.S.C. § 371 of International Application No. PCT/JP2018/039372, filed Oct. 23, 2018, designating the United States, which claims priority from Japanese Patent Application 2017-204686, filed Oct. 23, 2017, which are hereby incorporated herein by reference in their entirety.

TECHNICAL FIELD

The present disclosure relates to a member connection method.

BACKGROUND ART

Conventionally, a member connection method for connecting a first member and a second member by means of a copper sintered compact is known (see, for example, Patent Literature 1). Regarding this member connection method, there is a method of printing a coating film of a copper paste for connection by means of screen printing, dispensing printing, or the like. Specifically, first, during a printing process, a coating film of a copper paste for connection is formed by printing in a connection region between a first member and a second member. Subsequently, during a lamination process, the first member and the second member are laminated, with the coating film interposed therebetween. Then, during a sintering process, a copper sintered compact connecting the respective members with each other is formed by sintering of the coating film.

CITATION LIST

Patent Literature

Patent Literature 1: Japanese Unexamined Patent Publication No. 2008-244242

SUMMARY OF INVENTION

Technical Problem

In the conventional member connection method described above, during the printing process, a coating film is formed in the entire connection region, and during the subsequent lamination process, the respective members are laminated with the coating film interposed therebetween. At this time, since the entirety of the connecting surfaces (surface on the coating film side) of the respective members is in a state of being covered by the coating film, the area of the coating film is large, and air easily penetrates into the interior of the coating film. Furthermore, when the connecting surfaces of the respective members have surface unevenness, air also easily penetrates in between the coating film and the respective members due to this surface unevenness. As such, when the coating film is sintered during the sintering process in a state of having air penetrated therein, air remains as voids (pores) inside the copper sintered compact formed by sintering, or between the copper sintered compact and the respective members. The voids become structural defects of a connector body formed by the respective members being connected to each other, and can serve as a main cause for lowering the connectivity of the respective members.

It is an object of the present disclosure to provide a member connection method, by which voids inside a copper sintered compact or between a copper sintered compact and respective members can be suppressed.

Solution to Problem

The member connection method according to the present disclosure is a member connection method of connecting a first member and a second member by means of a copper sintered compact, the member connection method including: a printing step of forming a coating film of a copper paste for connection in a connection region between the first member and the second member into a predetermined print pattern; a lamination step of laminating the first member and the second member with the coating film interposed therebetween; and a sintering step of sintering the coating film to form the copper sintered compact and connecting the first member and the second member by means of this copper sintered compact, in which in the printing step, a coating film-formed region in which the coating film is formed, and a coating film non-formed region in which the coating film is not formed are formed in the print pattern, the coating film-formed region is divided into a plurality of regions by means of one or a plurality of the coating film non-formed regions provided so as to connect a first point and a second point, which are separated apart from each other in the marginal part of the connection region, and a plurality of the regions in the coating film-formed region includes at least one of regions that are arranged radially from the central side of the connection region toward the marginal part, and regions that are arranged concentrically around the center of the connection region.

In this member connection method, the print pattern formed in the printing step is composed of a coating film-formed region in which the coating film is formed, and a coating film non-formed region in which the coating film is not formed. Furthermore, the coating film-formed region is divided into a plurality of regions by means of one or a plurality of the coating film non-formed regions provided so as to connect a first point and a second point, which are separated apart from each other in the marginal part of the connection region. Thereby, when the respective members are laminated in the lamination step to have the coating film interposed therebetween, the coating film non-formed region functions as a release portion that releases air out of the connection region. The coating film non-formed region ceases to exist, as a plurality of regions of the coating film-formed region expands due to the own weights of the respective members, application of pressing pressure, or the like during the lamination step. Therefore, in the sintering step, the connection region is brought to a state in which a coating film of a copper paste is approximately uniformly applied thereon, and voids remaining in the interior of the copper sintered compact after sintering, or between the copper sintered compact and the respective members can be suppressed. Furthermore, in this member connection method, since a plurality of regions in the coating film-formed region includes at least one of regions that are arranged radially and regions that are arranged concentrically, it is possible to efficiently release air out of the connection region by means of the coating film non-formed region while uniformly expanding the coating film in the connection region. Therefore, a void-suppressing effect can be sufficiently secured.

Furthermore, a plurality of the regions in the coating film-formed region may include both the regions that are arranged radially and the regions that are arranged concentrically. In this case, it is possible to release air more efficiently out of the connection region by the coating film non-formed region, while the coating film is more uniformly expanded in the connection region.

Furthermore, a plurality of the regions in the coating film-formed region may include portions in which the regions that are arranged radially and the regions that are arranged concentrically are alternately disposed radially from the central side of the connection region toward the marginal part. In this case, it is possible to release air more efficiently out of the connection region by the coating film non-formed region, while the coating film is more uniformly expanded in the connection region.

Furthermore, the connection region may have a plurality of edges, and the coating film non-formed region may be provided so as to connect the first point and the second point, which are positioned at edges that are different from each other. In this case, it is possible to release air more efficiently out of the connection region by means of the coating film non-formed region.

Furthermore, the connection region may be a rectangular-shaped region, and the coating film-formed region may include regions disposed correspondingly to the corners of the connection region. In this case, deficiency of the coating film at the corners of the connection region can be prevented. Therefore, a state in which a coating film of a copper paste is applied approximately uniformly on the connection region can be formed more reliably.

Furthermore, a plurality of the regions in the coating film-formed region may have larger areas as the regions are disposed at positions closer to the marginal part of the connection region. In this case, deficiency of the coating film on the marginal part side of the connection region can be prevented. Therefore, a state in which a coating film of a copper paste is applied approximately uniformly on the connection region can be formed more reliably.

Furthermore, at least one of the first member and the second member may be a semiconductor element. By applying the member connection method described above to the connection of semiconductor elements, the production of a semiconductor device with high reliability can be realized.

Advantageous Effects of Invention

According to the present disclosure, a member connection method, by which voids inside a copper sintered compact or between a copper sintered compact and respective members can be suppressed, can be provided.

BRIEF DESCRIPTION OF DRAWINGS

FIG. 3 is a diagram illustrating a comparison of a conventional print pattern and the print pattern of the present embodiment.

FIG. 4 is photographs showing the results obtained by observing interfaces between a copper sintered compact after sintering and a first member using an ultrasonic observation device according to a conventional case and the present embodiment, respectively.

DESCRIPTION OF EMBODIMENTS

Figure 1:
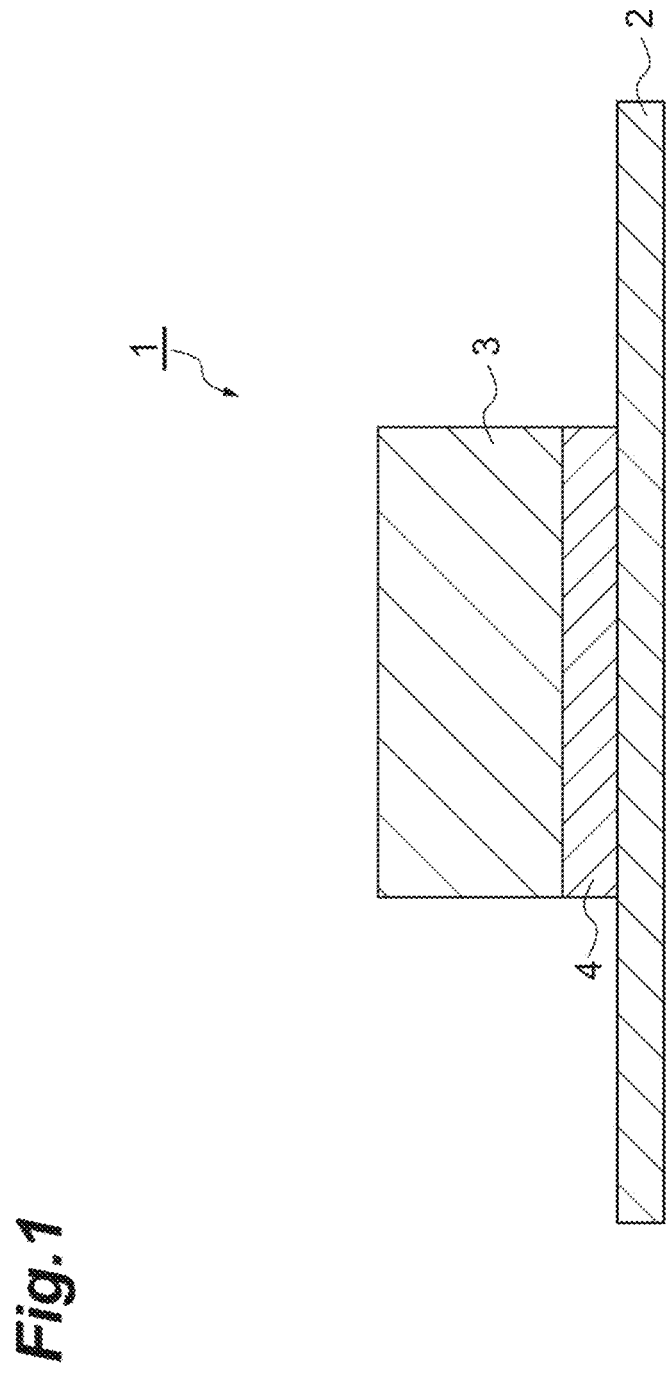
FIG. 1 is a schematic cross-sectional view of a connector body formed by being connected by the member connection method according to a first embodiment.

Hereinafter, suitable embodiments of the present invention will be described in detail with reference to the attached drawings. Meanwhile, in the description of the drawings, identical elements will be assigned with identical reference numerals, and overlapping descriptions will not be repeated. Unless particularly stated otherwise, the materials mentioned as examples in the present specification can be used singly or in combination of two or more kinds thereof. Regarding the content of each component in the metal paste for connection, in a case in which a plurality of substances corresponding to each component exists in the metal paste for connection, unless particularly stated otherwise, the content means the total amount of this plurality of substances existing in the metal paste for connection. A numerical value range described using the word "to" represents a range that includes the numerical values described before and after the word "to" as the minimum value and the maximum value, respectively. In regard to numerical value ranges described stepwise in the present specification, the upper limit or lower limit of a numerical value range of a certain stage may be replaced with the upper limit or lower limit of a numerical value range of another stage.

First Embodiment

First, an example of a connector body formed by being connected by the member connection method according to a first embodiment will be described. FIG. 1 is a schematic cross-sectional view of a connector body 1 formed by being connected by the member connection method according to the first embodiment.

As illustrated in FIG. 1, the connector body 1 has member 2 (first member); member 3 (second member); and a copper sintered compact 4 connecting the member 2 and the member 3. The term "connection" according to the present embodiment includes "junction", that is, being connected and then tied together. Examples of the respective members 2 and 3 include semiconductor elements such as an IGBT, a diode, a Schottky barrier diode, an MOS-FET, a thyristor, a logic circuit, a sensor, an analog integrated circuit, an LED, a semiconductor laser, and a transmitter; substrates for mounting semiconductor elements such as a lead frame, a metal plate-attached ceramic substrate (for example, a DBC), and an LED package; members for power feeding such as a copper ribbon, a metal block, and a terminal; a heat radiation plate; and a water cooling plate.

The copper sintered compact 4 is formed by sintering a copper paste having copper particles dispersed therein. The copper sintered compact 4 may include a component other than copper (for example, a metal other than copper, an alloy, an intermetallic compound, an inorganic compound, or a resin). Regarding the sintering method, pressureless sintering, pressure sintering (uniaxial pressure sintering or HIP sintering), electric current sintering, and the like can be used. In a case in which the copper sintered compact 4 of the present embodiment is intended for the connection of a semiconductor device, it is preferable that the copper sintered compact 4 is produced by pressureless sintering. Pressureless sintering can enhance the throughput as compared to pressure sintering and is therefore preferable from the viewpoint that the semiconductor element is not easily damaged.

Regarding the copper sintered compact 4, the degree of compactness of copper is preferably from 40% by volume to 95% by volume, more preferably from 50% by volume to 95% by volume, and even more preferably from 60% by volume to 95% by volume. When the degree of compactness of copper is in the above-described range, the mechanical characteristics, thermal conductivity, and electrical conductivity of the sintered compact itself can be sufficiently secured. Furthermore, an effect of stress relaxation is likely to be obtained when a member is connected thereto, and high connection reliability can be acquired.

The degree of compactness of copper for the copper sintered compact 4 can be determined by, for example, the following procedure. First, the copper sintered compact 4 is cut into a rectangular parallelepiped. Next, the longitudinal and transverse lengths of the copper sintered compact 4 are measured with vernier calipers or an external shape measuring apparatus, the thickness is measured with a film thickness meter, and thereby the volume of the copper sintered compact 4 is calculated. The apparent density $M_1$ (g/cm$^3$) is determined from the volume of the cut copper sintered compact 4 and the mass of the copper sintered compact measured with a precision balance. Using $M_1$ thus determined and the theoretical density 8.96 g/cm$^3$ of copper, the degree of compactness of copper (volume %) in the copper sintered compact is determined from the following Formula (A).

$$\text{Degree of compactness (volume \%) of copper in copper sintered compact} = [(M_1)/8.96] \times 100 \quad (A)$$

Next, the member connection method of the present embodiment will be described.

The member connection method of the present embodiment is a member connection method for connecting member 2 and member 3, and includes the following printing step, lamination step, and sintering step. First, in the printing step, a copper paste for connection is applied by printing on a connection region between the member 2 and the member 3, and thereby a coating film of this copper paste is formed into a predetermined print pattern. The connection region is a region in which the respective members 2 and 3 are connected to each other when the member 2 and the member 3 are viewed in a planar view. Regarding the printing method, for example, screen printing, transfer printing, offset printing, a jet printing method, a dispenser, a jet dispenser, a needle dispenser, a screw dispenser, a comma coater, a slit coater, a die coater, a gravure coater, slit coating, letterpress printing, intaglio printing, gravure printing, stencil printing, soft lithography, bar coating, an applicator, a particle deposition method, a spray coater, a spin coater, a dip coater, electrodeposition coating, or the like can be used.

Subsequently, in the lamination step, the member 2 and the member 3 are laminated with the coating film interposed therebetween. In the lamination step, a pressureless state in which only the own weights of the respective members 2 and 3 are applied to the coating film may be adopted, or a pressing pressure of 0.01 MPa or less, and preferably 0.005 MPa or less, may be applied to the coating film in addition to the own weights of the respective members 2 and 3. When the pressing pressure to be applied to the coating film is in the above-described range, since a special pressing apparatus is unnecessary, the yield is not impaired, and the reduction of voids, the die shear strength, and connection reliability can be enhanced. Regarding a method by which the coating film is subjected to a pressing pressure of 0.01 MPa or less, a method of loading a weight over the members 2 and 3 may be mentioned.

In the subsequent sintering step, the coating film is sintered by, for example, heat-treating the coating film, and thus a copper sintered compact 4 is formed. For the heating treatment, for example, a hot plate, a warm air dryer, a warm air heating furnace, a nitrogen dryer, an infrared dryer, an infrared heating furnace, a far-infrared heating furnace, a microwave heating apparatus, a laser heating apparatus, an electromagnetic heating apparatus, a heater heating apparatus, or a vapor heating furnace can be used. In the sintering step, the coating film is sintered in a state in which the own weights of the respective members 2 and 3, or a pressing pressure in the above-described range is applied to the coating film.

Figure 2:
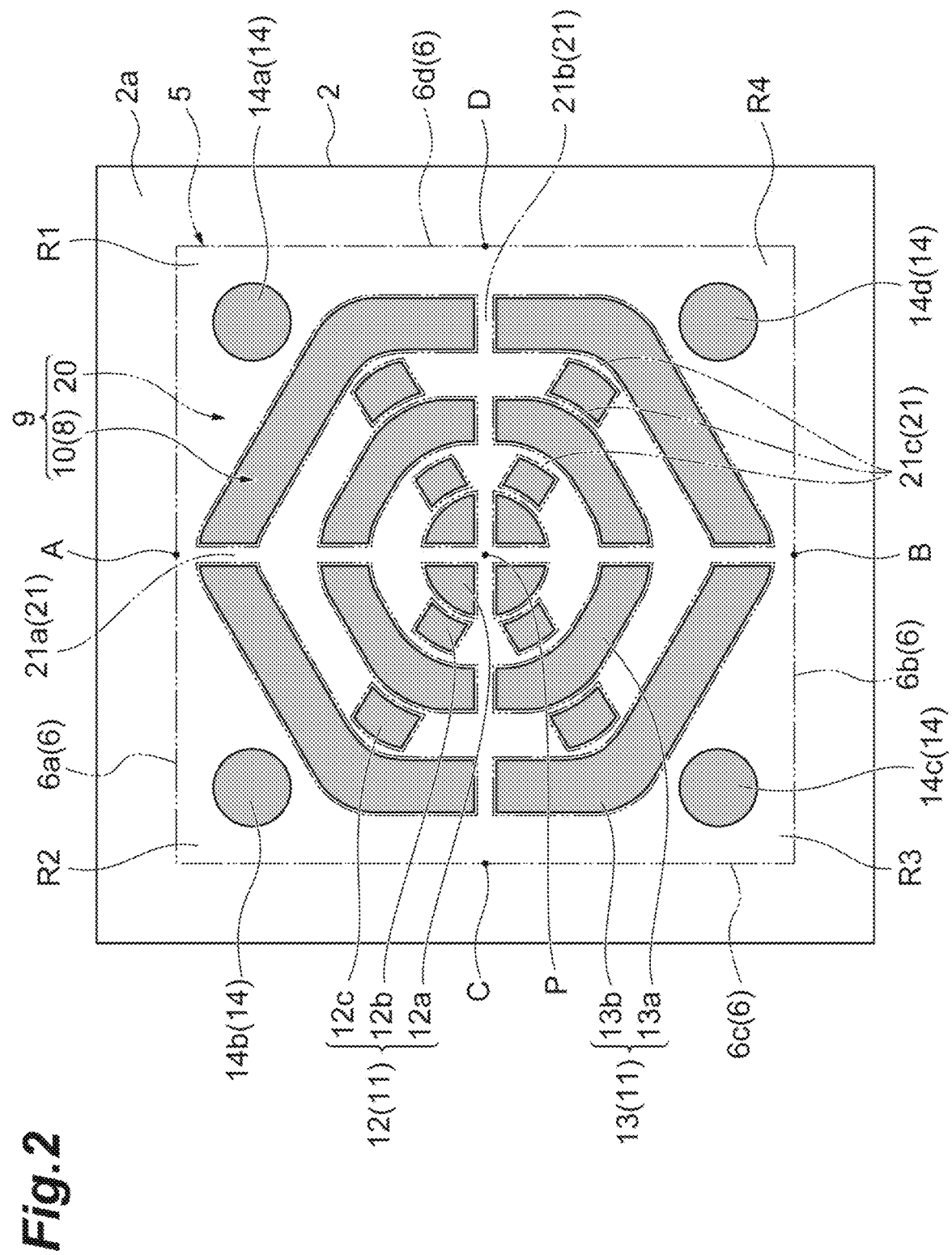
FIG. 2 is a plan view illustrating a print pattern formed in the printing step of the first embodiment.

Next, a print pattern 9 formed in the printing step of the present embodiment will be described in detail with reference to FIG. 2. FIG. 2 is a plan view illustrating the print pattern 9 formed in the printing step of the present embodiment. As illustrated in FIG. 2, the connection region 5 between the member 2 and the member 3 is also a printing region where the print pattern 9 is printed. The connection region 5 is a rectangular-shaped region having edges 6a and 6b that face each other and edges 6c and 6d that face each other in a direction perpendicular to the facing direction of the edges 6a and 6b. The marginal part 6 of the connection region 5 is configured to include edges 6a to 6d.

The connection region 5 is formed between the connecting surface of the member 2 and the connecting surface of the member 3, which face each other, in the lamination step. Meanwhile, FIG. 2 illustrates an embodiment in which the marginal part 6 of the connection region 5 is positioned inner to the connecting surface 2a of the member 2; however, the marginal part 6 of the connection region 5 may be consistent with the marginal part of the connecting surface 2a. The print pattern 9 is formed in the connection region 5. The print pattern 9 is composed of a coating film-formed region 10 in which a coating film 8 is formed, and a coating film non-formed region 20 in which the coating film 8 is not formed.

The coating film-formed region 10 includes division regions 11 and corner regions 14. The division regions 11 include radial regions 12 that are arranged radially from the center P side of the connection region 5 toward the marginal part 6; and concentric regions 13 that are disposed in a concentrically circular form or a concentrically polygonal form around the center P of the connection region 5. The center P refers to a point positioned such that the respective distances from the edges 6a and 6b in the marginal part 6 are equal to each other, and the respective distances from the edges 6c and 6d are equal to each other. Regarding the term "equal" according to the present embodiment, in addition to identical values, values including measurement errors or minute differences in a range set in advance may be considered equal. Being arranged radially means, for example, being disposed along a virtual straight line that faces the diameter direction extending from the center P side of the connection region 5 toward the marginal part 6 (hereinafter, simply referred to as "diameter direction"). Being disposed in a concentrically circular form or in a polygonal form means, for example, being disposed along a plurality of virtual concentric circles or virtual polygons having the center P of the connection region 5 as a shared center.

Specifically, the radial regions 12 include twelve regions 12a to 12c, three of them being disposed along each of four virtual straight lines extending from the center P of the connection region 5 toward the respective corners R1, R2, R3, and R4. That is, the radial regions 12 include three regions 12a to 12c along the same virtual straight line, in proportion to the number of virtual straight lines (four groups). The respective regions 12a to 12c along the same virtual straight line are aligned to be separated apart from one another in the diameter direction.

The concentric regions 13 include eight regions 13a and 13b, four of them being disposed along each of a virtual concentric circle and a virtual polygon, which mutually share the center P, and the distances of which from the center P are mutually different. That is, the concentric regions 13 include four regions 13a along the same virtual concentric circle and four regions 13b along the same virtual polygon. The virtual polygon is positioned near the marginal part 6, more distantly from the center P side than the virtual concentric circle. The four regions 13a and four regions 13b are respectively aligned to be separated apart from one another in the circumferential direction.

Compared to the area of the regions 12b positioned on the center P side, the area of the regions 12c positioned on the marginal part 6 side is larger. Furthermore, compared to the area of the respective regions 13a positioned on the center P side, the area of the respective regions 13b positioned on the marginal part 6 side is larger. That is, among a plurality of regions included in the division regions 11, the regions 12b and 12c and regions 13a and 13b (regions other than the regions 12a) have larger areas as the regions are disposed at positions closer to the marginal part 6 of the connection region 5.

The coating film-formed region 10 includes portions in which the radial regions 12 and the concentric regions 13 are alternately disposed radially from the center P side of the connection region 5 toward the marginal part 6. That is, in the coating film-formed region 10, regions 12c are respectively positioned between the respective regions 13a and the respective regions 13b, which are adjacent to each other in the diameter direction. The regions 12c of these radial regions 12 accomplish the role of embedding the spaces between the respective regions 13a and the respective regions 13b, which are adjacent to each other in the diameter direction in the concentric regions 13, in the coating film 8.

The corner regions 14 are regions disposed correspondingly to the respective corners R1 to R4 of the connection region 5. The corner regions 14 include region 14a disposed correspondingly to the corner R1; region 14b disposed correspondingly to the corner R2; region 14c disposed correspondingly to the corner R3; and region 14d disposed correspondingly to the corner R4. The respective regions 14a to 14d are positioned nearer to the marginal part 6 side than the respective outermost regions 13b in the concentric regions 13. The respective regions 14a to 14d are positioned so as to embed the marginal part 6 side, rather than the respective regions 13b, with the coating film 8.

The coating film non-formed region 20 is provided so as to connect a first point and a second point, which are separated from each other in the marginal part 6 of the connection region 5, and includes a plurality of line-shaped regions 21 that divide the coating film-formed region 10 into a plurality of regions (in the present embodiment, respective regions 12a to 12c and respective regions 13a and 13b). The line-shaped regions 21 function as release portions that release air out of the connection region 5 during the lamination step. The line-shaped regions 21 include a line-shaped region 21a that is provided so as to connect point A and point B in the marginal part 6 and releases air from at least one side of point A and point B; a line-shaped region 21b that is provided so as to connect point C and point D in the marginal part 6 and releases air from at least one side of point C and point D side; and a line-shaped region 21c that is provided so as to be linked to the line-shaped regions 21a and 21b and releases air via the line-shaped regions 21a and 21b.

The line-shaped region 21a stretches in the form of a straight line from an edge 6a to an edge 6b within the connection region 5. The line-shaped region 21a is positioned between the regions that face each other in the facing direction of edges 6a and 6c in the respective regions included in the division regions 11 (between the respective regions 12a, between the respective regions 13a, and between the respective region 13b).

The line-shaped region 21b stretches in the form of a straight line from an edge 6c to an edge 6d within the connection region 5. The line-shaped region 21b is positioned between the regions that face each other in the facing direction of edges 6c and 6d in the respective regions included in the division regions 11 (between the respective regions 12a, between the respective regions 13a, and between the respective region 13b).

The line-shaped regions 21c are such that a plurality of the regions (in the present embodiment, four) are aligned in the form of a concentric circle or in the form of a concentric polygon, the regions being at different distances from the center P side. The line-shaped regions 21c are positioned between regions that face each other in the diameter direction in the respective regions included in the division regions 11 (between the respective regions 12a and the respective regions 12b, between the respective regions 12b and the respective regions 13a, between the respective regions 13a and the respective regions 12c, and between the respective regions 12c and the respective regions 13b).

Next, the details of the copper paste for connection that is used in the printing step of the present embodiment will be described.

(Copper Paste for Connection)

The copper paste for connection of the present embodiment can include metal particles and a dispersing medium.

Examples of the metal particles according to the present embodiment include submicron copper particles, micro-copper particles, copper particles other than these, and other metal particles. The submicron copper particles according to the present specification mean particles having a particle size or a maximum diameter of more than or equal to 0.1 μm and less than 1.0 μm, and the micro-copper particles mean particles having a particle size or a maximum diameter of from 1.0 μm to 50 μm.

(Submicron Copper Particles)

The submicron copper particles may include copper particles having a particle size of from 0.12 μm to 0.8 μm, and for example, submicron copper particles having a volume average particle size of from 0.12 μm to 0.8 μm can be used. When the volume average particle size of the submicron copper particles is 0.12 μm or more, effects such as suppression of the cost for the synthesis of submicron copper particles, satisfactory dispersibility, and suppression of the amount of use of a surface treatment agent may be easily obtained. When the volume average particle size of the submicron copper particles is 0.8 µm or less, an effect that the sinterability of the submicron copper particles is excellent may be easily obtained. From the viewpoint of further providing the above-described effects, the volume average particle size of the submicron copper particles may be from 0.15 µm to 0.8 µm, may be from 0.15 µm to 0.6 µm, may be from 0.2 µm to 0.5 µm, or may be from 0.3 µm to 0.45 µm.

Meanwhile, the volume average particle size according to the present specification means the 50% volume average particle size. In the case of determining the volume average particle size of copper particles, the volume average particle size can be determined by a method of dispersing copper particles that serve as a raw material, or dried copper particles obtained by removing a volatile component from a copper paste for connection, in a dispersing medium using a dispersant, and making measurement for the dispersion using a light scattering method particle size distribution analyzer (for example, Shimadzu nanoparticle size distribution analyzer (SALD-7500nano, manufactured by SHIMADZU CORPORATION)), or the like. In the case of using a light scattering method particle size distribution analyzer, as the dispersing medium, hexane, toluene, α-terpineol, or the like can be used.

The submicron copper particles can include copper particles having a particle size of from 0.12 µm to 0.8 µm at a proportion of 10% by mass or more. From the viewpoint of sinterability of the copper paste for connection, the submicron copper particles can include copper particles having a particle size of from 0.12 µm to 0.8 µm at a proportion of 20% by mass or more, can include the copper particles at a proportion of 30% by mass or more, and can include the copper particles at a proportion of 100% by mass. When the percentage content of copper particles having a particle size of from 0.12 µm to 0.8 µm in the submicron copper particles is 20% by mass or more, dispersibility of the copper particles is further enhanced, and an increase in viscosity and a decrease in the paste concentration can be further suppressed.

The particle size of the copper particles can be determined by the following method. The particle size of the copper particles can be calculated from, for example, a SEM image. A powder of copper particles is loaded on a carbon tape for SEM with a spatula and is used as a sample for SEM. This sample for SEM is observed at a magnification ratio of 5,000 times by means of a SEM apparatus. A quadrangle circumscribing a copper particle in this SEM image is drawn by an image processing software program, and one of the edges is designated as the particle size of that particle.

The content of the submicron copper particles may be from 20% by mass to 90% by mass, may be from 30% by mass to 90% by mass, may be from 35% by mass to 85% by mass, or may be from 40% by mass to 80% by mass, on the basis of the total mass of the metal particles. When the content of the submicron copper particles is in the range described above, it becomes easy to form the copper sintered compact according to the present embodiment described above.

The content of the submicron copper particles may be from 20% by mass to 90% by mass on the basis of the sum of the mass of the submicron copper particles and the mass of flaky micro-copper particles. When the content of the submicron copper particles is 20% by mass or more, the spaces between flaky micro-copper particles can be sufficiently filled, and it is easy to form the copper sintered compact according to the present embodiment described above. When the content of the submicron copper particles is 90% by mass or less, since volume shrinkage at the time of sintering the copper paste for connection can be sufficiently suppressed, it is easy to form the copper sintered compact according to the present embodiment described above. From the viewpoint of further providing the above-described effects, the content of the submicron copper particles may be from 30% by mass to 85% by mass, may be from 35% by mass to 85% by mass, or may be from 40% by mass to 80% by mass, on the basis of the sum of the mass of the submicron copper particles and the mass of flaky micro-copper particles.

The shape of the submicron copper particles is not particularly limited. Examples of the shape of the submicron copper particles include a spherical shape, a lump shape, a needle shape, a flake shape, an approximately spherical shape, and aggregates of these. From the viewpoints of dispersibility and packability, the shape of the submicron copper particles may be a spherical shape, an approximately spherical shape, or a flake shape, and from the viewpoints of combustibility, dispersibility, and miscibility with flaky micro-copper particles, the shape may be a spherical shape or an approximately spherical shape. According to the present specification, the "flake shape" includes flat plate-like shapes such as a plate shape and a scale-like shape.

Regarding the submicron copper particles, from the viewpoints of dispersibility, packability, and miscibility with flaky micro-copper particles, the aspect ratio may be 5 or less, or may be 3 or less. According to the present specification, the "aspect ratio" represents the ratio of long edge/thickness of a particle. Measurement of the long edge and thickness of a particle can be determined from, for example, a SEM image of the particle.

The submicron copper particles may be treated with a particular surface treatment agent. As the particular surface treatment agent, for example, an organic acid having 8 to 16 carbon atoms may be mentioned. Examples of the organic acid having 8 to 16 carbon atoms include saturated fatty acids such as caprylic acid, methylheptanoic acid, ethylhexanoic acid, propylpentanoic acid, pelargonic acid, methyloctanoic acid, ethylheptanoic acid, propylhexanoic acid, capric acid, methylnonanoic acid, ethyloctanoic acid, propylheptanoic acid, butylhexanoic acid, undecanoic acid, methyldecanoic acid, ethylnonanoic acid, propyloctanoic acid, butylheptanoic acid, lauric acid, methylundecanoic acid, ethyldecanoic acid, propylnonanoic acid, butyloctanoic acid, pentylheptanoic acid, tridecanoic acid, methyldodecanoic acid, ethylundecanoic acid, propyldecanoic acid, butylnonanoic acid, pentyloctanoic acid, myristic acid, methyltridecanoic acid, ethyldodecanoic acid, propylundecanoic acid, butyldecanoic acid, pentylnonanoic acid, hexyloctanoic acid, pentadecanoic acid, methyltetradecanoic acid, ethyltridecanoic acid, propyldodecanoic acid, butylundecanoic acid, pentyldecanoic acid, hexylnonanoic acid, palmitic acid, methylpentadecanoic acid, ethyltetradecanoic acid, propyltridecanoic acid, butyldodecanoic acid, pentylundecanoic acid, hexyldecanoic acid, heptylnonanoic acid, methylcyclohexanecarboxylic acid, ethylcyclohexanecarboxylic acid, propylcyclohexanecarboxylic acid, butylcyclohexanecarboxylic acid, pentylcyclohexanecarboxylic acid, hexylcyclohexanecarboxylic acid, heptylcyclohexanecarboxylic acid, octylcyclohexanecarboxylic acid, and nonylcyclohexanecarboxylic acid; unsaturated fatty acids such as octenoic acid, nonenoic acid, methylnonenoic acid, decenoic acid, undecenoic acid, dodecenoic acid, tridecenoic acid, tetradecenoic acid, myristoleic acid, pentadecenoic acid, hexadecenoic acid, palmitoleic acid, and sapienic acid; and aromatic carboxylic acids such as terephthalic acid, pyromellitic acid, o-phenoxybenzoic acid, methylbenzoic acid, ethylbenzoic acid, propylbenzoic acid, butylbenzoic acid, pentylbenzoic acid, hexylbenzoic acid, heptylbenzoic acid, octylbenzoic acid, and nonylbenzoic acid. The organic acids may be used singly, or two or more kinds thereof may be used in combination. When such an organic acid and the submicron copper particles are combined, there is a tendency that both the dispersibility of the submicron copper particles and the eliminability of the organic acid at the time of sintering can be achieved.

The throughput of the surface treatment agent may be from 0.07% by mass to 2.1% by mass, may be from 0.10% by mass to 1.6% by mass, or may be from 0.2% by mass to 1.1% by mass.

Regarding the submicron copper particles, commercially available products can be used. Examples of commercially available submicron copper particles include Cu-C-40 (manufactured by Fukuda Metal Foil & Powder Co., Ltd., volume average particle size 0.6 µm), EFC-20LML (manufactured by Fukuda Metal Foil & Powder Co., Ltd., number average particle size 0.2 µm), CH-0200 (manufactured by MITSUI MINING & SMELTING CO., LTD., volume average particle size 0.36 µm), HT-14 (manufactured by MITSUI MINING & SMELTING CO., LTD., volume average particle size 0.41 µm), CT-500 (manufactured by MITSUI MINING & SMELTING CO., LTD., volume average particle size 0.72 µm), and Tn-Cu100 (manufactured by TAIYO NIPPON SANSO CORPORATION, volume average particle size 0.12 µm).

(Micro-Copper Particles)

The micro-copper particles may include copper particles having a particle size of from 2 µm to 50 µm, and for example, copper particles having a volume average particle size of from 2 µm to 50 µm can be used. When the volume average particle size of the micro-copper particles is in the above-described range, volume shrinkage at the time of sintering a copper paste for connection can be sufficiently reduced, and it is easy to secure the connection strength of a connector body produced by sintering a copper paste for connection. In a case in which a copper paste for connection is used for the connection of semiconductor elements, when the volume average particle size of the micro-copper particles is in the range described above, the semiconductor device tends to exhibit satisfactory die shear strength and connection reliability. From the viewpoint of further providing the above-described effects, the volume average particle size of the micro-copper particles may be from 3 µm to 20 µm, or may be from 3 µm to 10 µm.

The micro-copper particles can include copper particles having a particle size of from 2 µm to 50 µm at a proportion of 50% by mass or more. From the viewpoints of orientation within a connector body, a reinforcing effect, and packability of the connection paste, the micro-copper particles can include copper particles having a particle size of from 2 µm to 50 µm at a proportion of 70% by mass or more, can include at a proportion of 80% by mass or more, or can include at a proportion of 100% by mass. From the viewpoint of suppressing connection failure, it is preferable that the micro-copper particles do not include, for example, particles having a size that exceeds the connection thickness, such as particles having a maximum diameter of more than 20 µm.

The content of the micro-copper particles may be from 10% by mass to 90% by mass, may be from 15% by mass to 65% by mass, or may be from 20% by mass to 60% by mass, on the basis of the total mass of the metal particles. When the content of the micro-copper particles is in the range described above, it is easy to secure the connection strength of a connector body produced by sintering the copper paste for connection. In a case in which the copper paste for connection is used for the connection of semiconductor elements, when the content of the micro-copper particles is in the range described above, there is a tendency that the semiconductor device exhibits satisfactory die shear strength and connection reliability.

The sum of the content of the submicron copper particles and the content of the micro-copper particles can be adjusted to 80% by mass or more on the basis of the total mass of the metal particles. When the sum of the content of the submicron copper particles and the content of the micro-copper particles is in the above-described range, the volume shrinkage at the time of sintering the copper paste for connection can be sufficiently reduced, and it is easy to secure the connection strength of a connector body produced by sintering the copper paste for connection. In a case in which the copper paste for connection is used for the connection of semiconductor elements, the semiconductor device tends to exhibit satisfactory die shear strength and connection reliability. From the viewpoint of further providing the above-described effects, the sum of the content of the submicron copper particles and the content of the micro-copper particles may be 90% by mass or more, may be 95% by mass or more, or may be 100% by mass, on the basis of the total mass of the metal particles.

The shape of the micro-copper particles is not particularly limited. Examples of the shape of the micro-copper particles include a spherical shape, a lump shape, a needle shape, a flake shape, an approximately spherical shape, and aggregates of these. Above all, the shape of the micro-copper particles is preferably a flake shape. By using flake-shaped micro-copper particles, the micro-copper particles in the copper paste for connection are oriented approximately parallel to the connecting surface, thereby the volume shrinkage at the time of sintering the copper paste for connection can be suppressed, and it is easy to secure the connection strength of a connector body produced by sintering the copper paste for connection. In a case in which the copper paste for connection is used for the connection of semiconductor elements, the semiconductor device tends to exhibit satisfactory die shear strength and connection reliability. From the viewpoint of further providing the above-described effects, regarding the flake-shaped micro-copper particles, above all, the aspect ratio may be 4 or higher, or may be 6 or higher.

With regard to the micro-copper particles, the presence or absence of the treatment with a surface treatment agent is not particularly limited. From the viewpoints of dispersion stability and oxidation resistance, the micro-copper particles may be treated with a surface treatment agent. The surface treatment agent may be eliminated at the time of connection. Examples of such a surface treatment agent include aliphatic carboxylic acids such as palmitic acid, stearic acid, arachidic acid, and oleic acid; aromatic carboxylic acids such as terephthalic acid, pyromellitic acid, and o-phenoxybenzoic acid; aliphatic alcohols such as cetyl alcohol, stearyl alcohol, isobornyl cyclohexanol, and tetraethylene glycol; aromatic alcohols such as p-phenylphenol; alkylamines such as octylamine, dodecylamine, and stearylamine; aliphatic nitriles such as stearonitrile and decanenitrile; silane coupling agents such as an alkylalkoxysilane; and polymer treatment agents such as polyethylene glycol, polyvinyl alcohol, polyvinylpyrrolidone, and a silicone oligomer. The surface treatment agents may be used singly, or two or more kinds thereof may be used in combination. The throughput of the surface treatment agent is usually 0.001% by mass or more.

In a case in which a copper paste for connection is prepared from the submicron copper particles only, since the volume shrinkage and sintering shrinkage that are concomitant to drying of the dispersing medium occur significantly, at the time of sintering the copper paste for connection, the copper paste is easily detached from the adherend surface, and it is difficult to obtain sufficient die shear strength and connection reliability for the connection of semiconductor elements or the like. When submicron copper particles and micro-copper particles are used in combination, volume shrinkage at the time of sintering the copper paste for connection is suppressed, and the connector body can have sufficient connection strength. In a case in which the copper paste for connection is used for the connection of semiconductor elements, an effect that the semiconductor device exhibits satisfactory die shear strength and connection reliability is obtained.

Regarding the micro-copper particles according to the present embodiment, commercially available products can be used. Examples of commercially available micro-copper particles include MA-C025 (manufactured by MITSUI MINING & SMELTING CO., LTD., volume average particle size 7.5 μm), MA-C025KFD (manufactured by MITSUI MINING & SMELTING CO., LTD., volume average particle size 5 μm), MA-C08JF (manufactured by MITSUI MINING & SMELTING CO., LTD., volume average particle size 13.2 μm), 3L3 (manufactured by Fukuda Metal Foil & Powder Co., Ltd., volume average particle size 6.0 μm), 2L3 (manufactured by Fukuda Metal Foil & Powder Co., Ltd., volume average particle size 10.0 μm), 4L3 (manufactured by Fukuda Metal Foil & Powder Co., Ltd., volume average particle size 3.0 μm), C3 (manufactured by Fukuda Metal Foil & Powder Co., Ltd., volume average particle size 37.0 μm), E3 (manufactured by Fukuda Metal Foil & Powder Co., Ltd., volume average particle size 37.0 μm), 1110F (manufactured by MITSUI MINING & SMELTING CO., LTD., volume average particle size 3.8 μm), 1400YP (manufactured by MITSUI MINING & SMELTING CO., LTD., volume average particle size 5.2 μm), 1400YF (manufactured by MITSUI MINING & SMELTING CO., LTD., volume average particle size 6.8 μm), 1050YP (manufactured by MITSUI MINING & SMELTING CO., LTD., volume average particle size 0.94 μm), 1050YF (manufactured by MITSUI MINING & SMELTING CO., LTD., volume average particle size 1.7 μm), and Cu-HWQ (manufactured by Fukuda Metal Foil & Powder Co., Ltd., volume average particle size 3.0 μm).

(Other Metal Particles Other than Copper Particles)

The metal particles may include other metal particles other than the submicron copper particles and the micro-copper particles, for example, particles of nickel, silver, gold, palladium, and platinum may be included. The other metal particles are such that the volume average particle size may be from 0.01 μm to 10 μm, may be from 0.01 μm to 5 μm, or may be from 0.05 μm to 3 μm. In a case in which the metal particles include the other metal particles, from the viewpoint of obtaining sufficient connectivity, the content of the other metal particles may be less than 20% by mass, or may be 10% by mass or less, on the basis of the total mass of the metal particles. The other metal particles may not be included. The shape of the other metal particles is not particularly limited.

When metal particles other than copper particles are included, since a sintered compact having a plurality of kinds of metals solid-solubilized or dispersed therein can be obtained, mechanical characteristics such as yield stress and fatigue strength of the sintered compact are improved, and connection reliability is likely to be enhanced. Furthermore, when a plurality of kinds of metal particles is added, a sintered compact of the copper paste for connection can have sufficient connection strength for a particular adherend. In a case in which the copper paste for connection is used for the connection of semiconductor elements, the die shear strength and connection reliability of the semiconductor device are likely to be easily enhanced.

(Dispersing Medium)

The dispersing medium is not particularly limited and may be volatile. Examples of a volatile dispersing medium include monohydric and polyhydric alcohols such as pentanol, hexanol, heptanol, octanol, decanol, ethylene glycol, diethylene glycol, propylene glycol, butylene glycol, α-terpineol, and isobornyl cyclohexanol (MTPH); ethers such as ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether; esters such as ethylene glycol ethyl ether acetate, ethylene glycol butyl ether acetate, diethylene glycol ethyl ether acetate, diethylene glycol butyl ether acetate, dipropylene glycol methyl ether acetate (DPMA), ethyl lactate, butyl lactate, tributyrin, butyl stearate, squalane, dibutyl sebacate, bis(2-ethylhexyl) adipate, γ-butyrolactone, and propylene carbonate; acid amides such as N-methyl-2-pyrrolidone, N,N-dimethylacetamide, and N,N-dimethylformamide; aliphatic hydrocarbons such as cyclohexane, octane, nonane, decane, and undecane; aromatic hydrocarbons such as benzene, toluene, and xylene; mercaptans having an alkyl group having 1 to 18 carbon atoms; and mercaptans having a cycloalkyl group having 5 to 7 carbon atoms. Examples of the mercaptans having an alkyl group having 1 to 18 carbon atoms include ethylmercaptan, n-propylmercaptan, i-propylmercaptan, n-butylmercaptan, i-butylmercaptan, t-butylmercaptan, pentylmercaptan, hexylmercaptan, and dodecylmercaptan. Examples of the mercaptans having a cycloalkyl group having 5 to 7 carbon atoms include cyclopentylmercaptan, cyclohexylmercaptan, and cycloheptylmercaptan.

The content of the dispersing medium may be 5 to 50 parts by mass, when the total mass of the metal particles is designated as 100 parts by mass. When the content of the dispersing medium is in the range described above, the copper paste for connection can be adjusted to have a more appropriate viscosity, and also, sintering of copper particles are not easily inhibited.

(Additives)

In the copper paste for connection, if necessary, wetting enhancers such as a nonionic surfactant and a fluorine-based surfactant; antifoaming agents such as silicone oil; ion trapping agents such as an inorganic ion exchanger, and the like may be added as appropriate.

Next, the action and effects of the member connection method of the present embodiment will be described in comparison with conventional member connection methods.

Conventional member connection methods are different from the viewpoint that the print pattern in the printing step is different, compared to the member connection method of the present embodiment. FIG. 3 is a diagram illustrating a comparison of a conventional print pattern and the print pattern of the present embodiment. FIG. 3(a) illustrates a conventional print pattern 100, and FIG. 3(b) illustrates a print pattern 9 of the present embodiment. FIG. 4 is photographs showing the results obtained by observing interfaces between a copper sintered compact 4 after sintering and the member 2 using an ultrasonic observation device. FIG. 4(a) shows the results of the case of a conventional print pattern 100 of FIG. 3(a), and FIG. 4(b) shows the results of the case of a print pattern 9 of the present embodiment of FIG. 3(b). In FIG. 4, the connection region 5 is presented by means of dotted lines.

As illustrated in FIG. 3(a), in the printing step of the conventional member connection method, the print pattern 100 to be formed has a rectangular shape along the marginal part 6 of the connection region 5. That is, a coating film 8 is formed over the entirety of the connection region 5. Therefore, when the respective members 2 and 3 are laminated with the coating film 8 interposed therebetween in a subsequent lamination step, the area of the coating film 8 that covers the entirety of the respective connecting surfaces of the members 2 and 3 is large, and air easily penetrates into the interior of the coating film 8. Furthermore, when the connecting surfaces of the respective members 2 and 3 have surface unevenness, air also easily penetrates in between the coating film 8 and the respective members 2 and 3 due to this surface unevenness. When the coating film 8 is sintered in the sintering step in a state in which air has penetrated thereinto as such, air remains as voids (pores) in the interior of the copper sintered compact 4 formed by sintering, or between the copper sintered compact 4 and the respective members 2 and 3. For example, as shown in FIG. 4(a), voids shown in white remain between the copper sintered compact 4 and the member 2. Voids become structural defects of a connector body 1 that is formed as the respective members 2 and 3 are connected to each other, and can serve as a main cause for lowering the connectivity of the respective members 2 and 3.

In contrast, as illustrated in FIG. 3(b), in the member connection method of the present embodiment, the print pattern 9 formed in the printing step is composed of a coating film-formed region 10 in which the coating film 8 is formed, and a coating film non-formed region 20 in which the coating film 8 is not formed. Furthermore, the coating film-formed region 10 is divided into a plurality of regions 12a to 12c and 13a and 13b by means of line-shaped regions 21a to 21c (line-shaped regions 21). Thereby, in the lamination step, air that has penetrated into the interior of the coating film 8, and air that has penetrated between the coating film 8 and the respective members 2 and 3 flow from the respective regions 12a to 12c and 13a and 13b directly into the line-shaped regions 21a and 21b, or flow from the respective regions 12a to 12c and 13a and 13b into the line-shaped regions 21a and 21b through the line-shaped region 21c. The air that has flowed into the line-shaped regions 21a and 21b can escape out of the connection region 5 from the marginal part 6 of the connection region 5. The coating film non-formed region 20 ceases to exist, as a plurality of regions 12a to 12c, 13a and 13b, and 14a to 14d expands due to the respective own weights of the members 2 and 3, application of pressing pressure, or the like during the lamination step. Therefore, in the sintering step, the connection region 5 is brought to a state in which a coating film 8 of a copper paste is approximately uniformly applied thereon, and voids remaining in the interior of the copper sintered compact 4 after sintering, or between the copper sintered compact 4 and the respective members 2 and 3 can be suppressed. For example, as shown in FIG. 4(b), voids do not remain between the copper sintered compact 4 and the member 2. As a result, connectivity of the respective members 2 and 3 can be enhanced.

Meanwhile, regarding the print pattern 9 of the present embodiment, it is necessary to make the print thickness thick compared to conventional print patterns; however, an amount of printing equal to that of the conventional print pattern 100 can be used by adjusting the print volume. Therefore, suppression of voids can be realized with an amount of coating equivalent to that of the conventional print pattern 100.

In the present embodiment, the coating film-formed region 10 includes the radial regions 12 that are arranged radially, and the concentric regions 13 that are arranged in the form of a concentric circle or in the form of a concentric polygon. Therefore, it is possible to release air efficiently out of the connection region 5 by means of the line-shaped regions 21a to 21c, and a void-suppressing effect can be sufficiently secured.

Furthermore, in the present embodiment, the coating film-formed region 10 includes a portion in which the radial regions 12 and the concentric regions 13 are alternately disposed radially from the center P side of the connection region 5 toward the marginal part 6. Thereby, deficiency of the coating film 8 between the respective regions 13a and the respective regions 13b, which are adjacent to each other in the diameter direction, can be prevented. Therefore, a state in which the coating film 8 of a copper paste is applied approximately uniformly in the connection region 5 can be formed more reliably. Furthermore, in the present embodiment, the connection region 5 has a plurality of edges 6a to 6d, and the coating film non-formed region 20 is provided so as to connect points A and B and points C and D, which are positioned at edges that are different from each other. Through such a configuration, air can be released more efficiently out of the connection region by means of the coating film non-formed region 20, while the coating film 8 is expanded more uniformly in the connection region 5.

Furthermore, in the present embodiment, the coating film-formed region 10 includes the corner regions 14 that are disposed correspondingly to the respective corners R1 to R4 of the connection region 5. Therefore, deficiency of the coating film 8 at the respective corners R1 to R4 of the connection region 5 can be prevented. Furthermore, a plurality of regions 12b and 12c and 13a and 13b included in the division regions 11 has larger areas as the regions are disposed at positions closer to the marginal part 6 of the connection region 5. Therefore, deficiency of the coating film 8 on the marginal part 6 side of the connection region 5 can be prevented.

By applying the member connection method of the present embodiment to the connection of semiconductor elements, production of a semiconductor device with high reliability can be realized.

Second Embodiment

Figure 5:
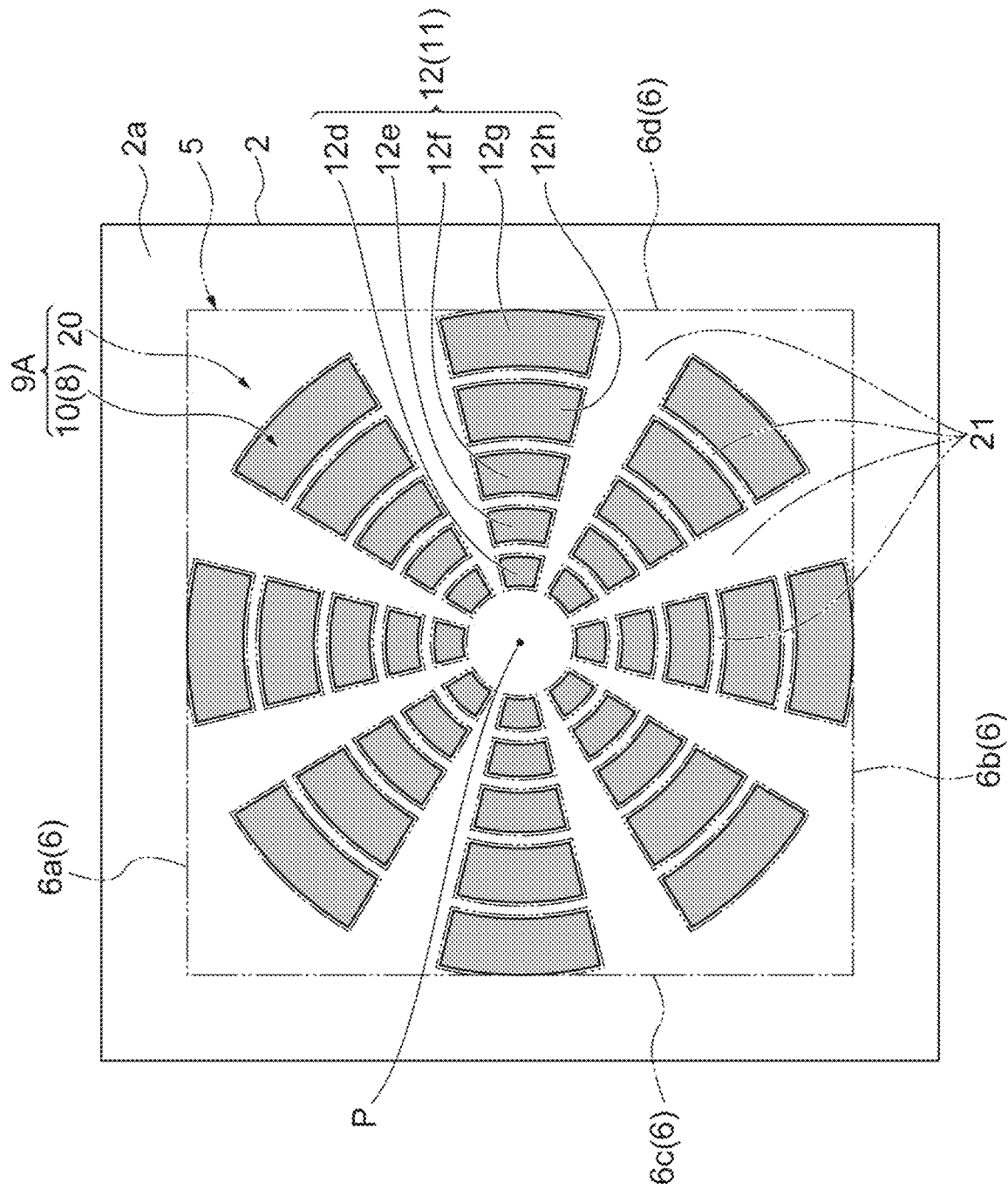
FIG. 5 is a plan view illustrating a print pattern of a second embodiment.

Next, a print pattern 9A that is formed in a printing step of a member connection method according to a second embodiment will be described with reference to FIG. 5. FIG. 5 is a plan view illustrating the print pattern 9A of the second embodiment. In the second embodiment, as illustrated in FIG. 5, the coating film-formed region 10 includes division regions 11 only and does not include corner regions 14, while the division regions 11 include only radial regions 12 that are arranged radially from the central side of the connection region 5 toward the marginal part 6.

Specifically, the radial regions 12 include forty regions 12d to 12h, five of them being disposed along each of eight virtual straight lines extending from the center P in the connection region 5 toward the marginal part 6. That is, the radial regions 12 include five regions 12d to 12h along the same virtual straight line, in proportion to the number of virtual straight lines (eight groups). The respective regions 12d to 12h along the same virtual straight line are aligned to be separated apart from one another in the diameter direction.

The areas of the respective regions 12d to 12h along the same virtual straight line increase in the order of region 12d, region 12e, region 12f, region 12g, and region 12h. That is, a plurality of the regions 12d to 12h included in the division regions 11 has larger areas as the regions are disposed at positions closer to the marginal part 6 of the connection region 5.

According to the present embodiment, a coating film non-formed region 20 is provided so as to connect a first point and a second point that are separated apart from each other in the marginal part 6 of the connection region 5, and includes a plurality of line-shaped regions 21 that divide the coating film-formed region 10 into a plurality of regions (in the present embodiment, respective regions 12d to 12h). Therefore, when the respective members 2 and 3 are laminated with a coating film 8 interposed therebetween in the lamination step, the line-shaped regions 21 function as release portions that release air out of the connection region 5. Therefore, similarly to the embodiment described above, voids remaining in the interior of the copper sintered compact 4 after sintering, or between the copper sintered compact 4 and the respective members 2 and 3, can be suppressed.

Third Embodiment

Figure 6:
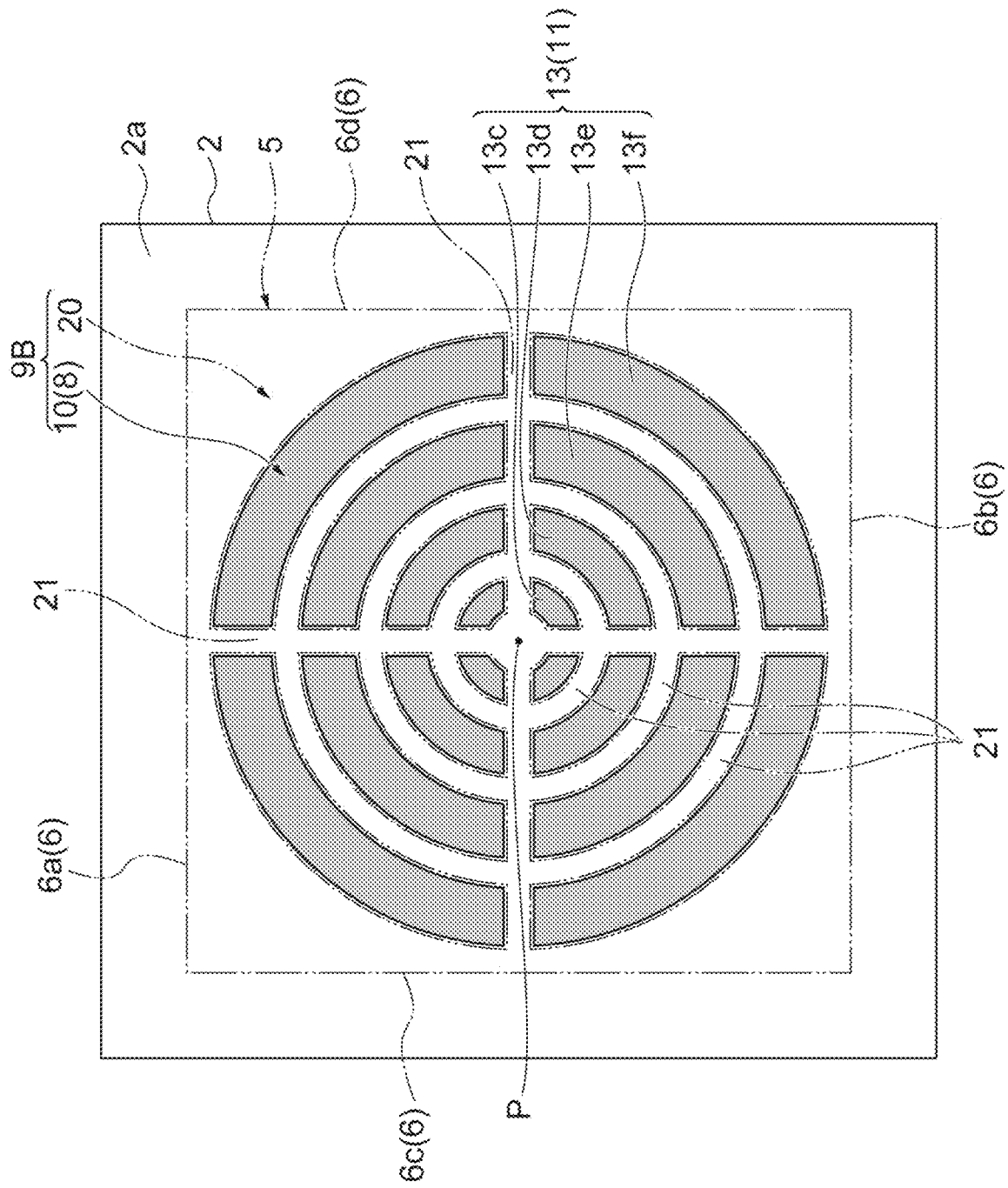
FIG. 6 is a plan view illustrating a print pattern of a third embodiment.

Next, a print pattern 9B that is formed in a printing step of a member connection method according to a third embodiment will be described with reference to FIG. 6. FIG. 6 is a plan view illustrating the print pattern 9B of the third embodiment. In the third embodiment, as illustrated in FIG. 6, division regions 11 include only concentric regions 13 that are disposed in the form of concentric circles around the center P of the connection region 5.

Specifically, the concentric regions 13 include sixteen regions 13c to 13f, four of them being disposed along each of four virtual concentric circles, which mutually share the center P, and the distances of which from the center P are mutually different. That is, the concentric regions 13 include four of the respective regions 13c to 13f along the same virtual concentric circle, in proportion to the number of virtual concentric circles (four groups). The respective regions 13c to 13f along the same virtual concentric circle are respectively aligned to be separated from one another in the circumferential direction.

The respective areas of the regions 13c to 13f increase in the order of region 13c, region 13d, region 13e, and region 13f. That is, a plurality of regions 13c to 13f included in the division regions 11 has large areas as the regions are disposed at positions closer to the marginal part 6 of the connection region 5.

In the present embodiment as well, a coating film non-formed region 20 is provided so as to connect a first point and a second point that are separated apart from each other in the marginal part 6 of the connection region 5, and includes a plurality of line-shaped regions 21 that divide the coating film-formed region 10 into a plurality of regions (in the present embodiment, respective regions 13c to 13f). Therefore, when the respective members 2 and 3 are laminated with a coating film 8 interposed therebetween in the lamination step, the line-shaped regions 21 function as release portions that release air out of the connection region 5. Therefore, similarly to the embodiments described above, voids remaining in the interior of the copper sintered compact 4 after sintering, or between the copper sintered compact 4 and the respective members 2 and 3, can be suppressed.

Fourth Embodiment

Figure 7:
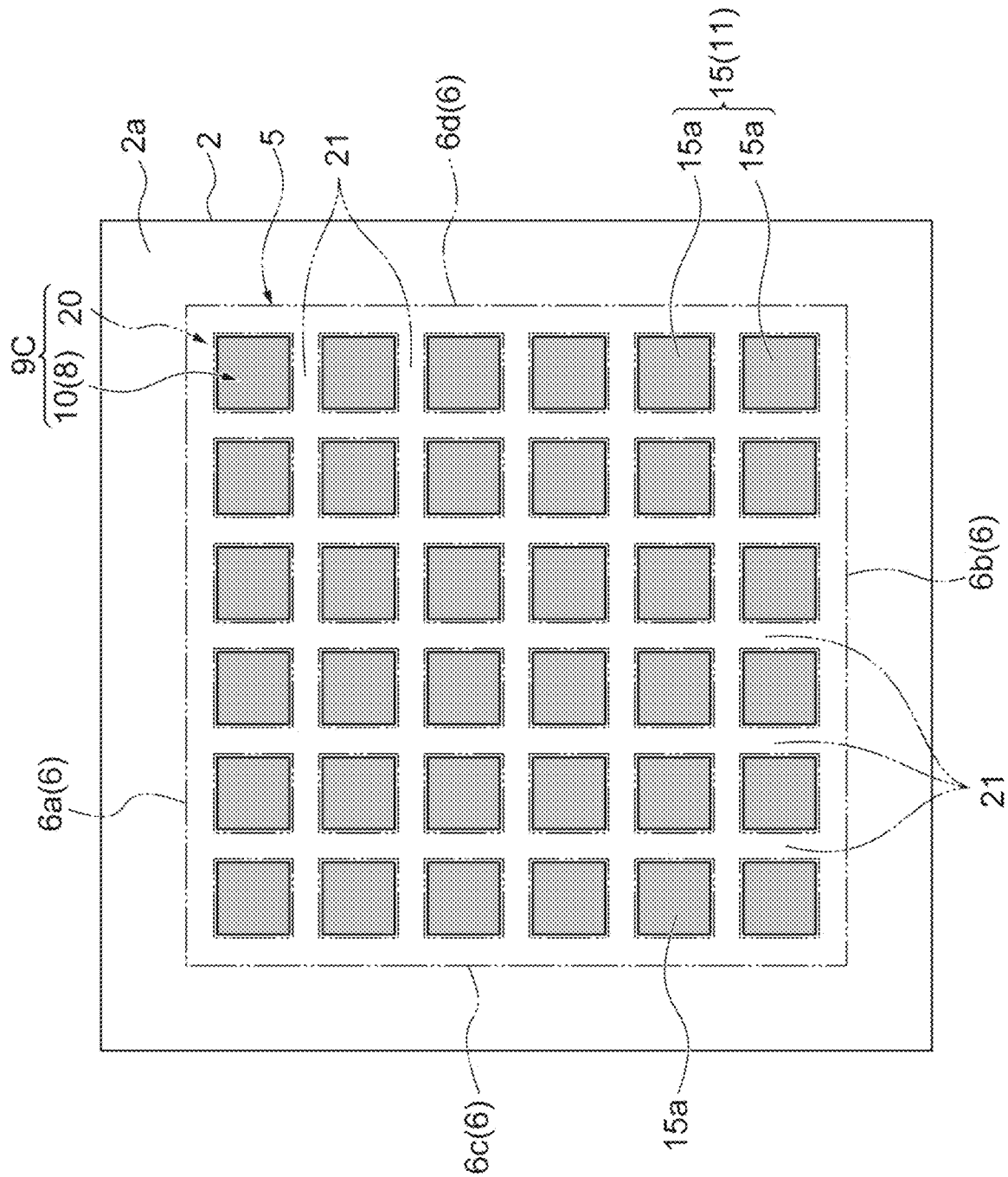
FIG. 7 is a plan view illustrating a print pattern of a fourth embodiment.

Next, a print pattern 9C that is formed in a printing step of a member connection method according to a fourth embodiment will be described with reference to FIG. 7. FIG. 7 is a plan view illustrating the print pattern 9C of the fourth embodiment. In the fourth embodiment, as illustrated in FIG. 7, the division regions 11 include only a lattice region 15 that is arranged in a lattice form. Being arranged in a lattice form means, for example, being disposed at intersection points of equispaced virtual horizontal lines and virtual vertical lines in the form of network in the connection region 5. In the present embodiment, the lattice region 15 in the connection region 5 includes thirty-six rectangular-shaped regions 15a in total arranged in six columns and six rows.

In the present embodiment as well, a coating film non-formed region 20 is provided so as to connect a first point and a second point that are separated apart from each other in the marginal part 6 of the connection region 5, and includes a plurality of line-shaped regions 21 that divide the coating film-formed region 10 into a plurality of regions (in the present embodiment, respective regions 15a). Therefore, when the respective members 2 and 3 are laminated with a coating film 8 interposed therebetween in the lamination step, the line-shaped regions 21 function as release portions that release air out of the connection region 5. Therefore, similarly to the embodiments described above, voids remaining in the interior of the copper sintered compact 4 after sintering, or between the copper sintered compact 4 and the respective members 2 and 3, can be suppressed. In the present embodiment as well, it is possible to release air efficiently out of the connection region 5 by means of a plurality of the line-shaped regions 21, and a void-suppressing effect can be sufficiently secured.

Fifth Embodiment

Figure 8:
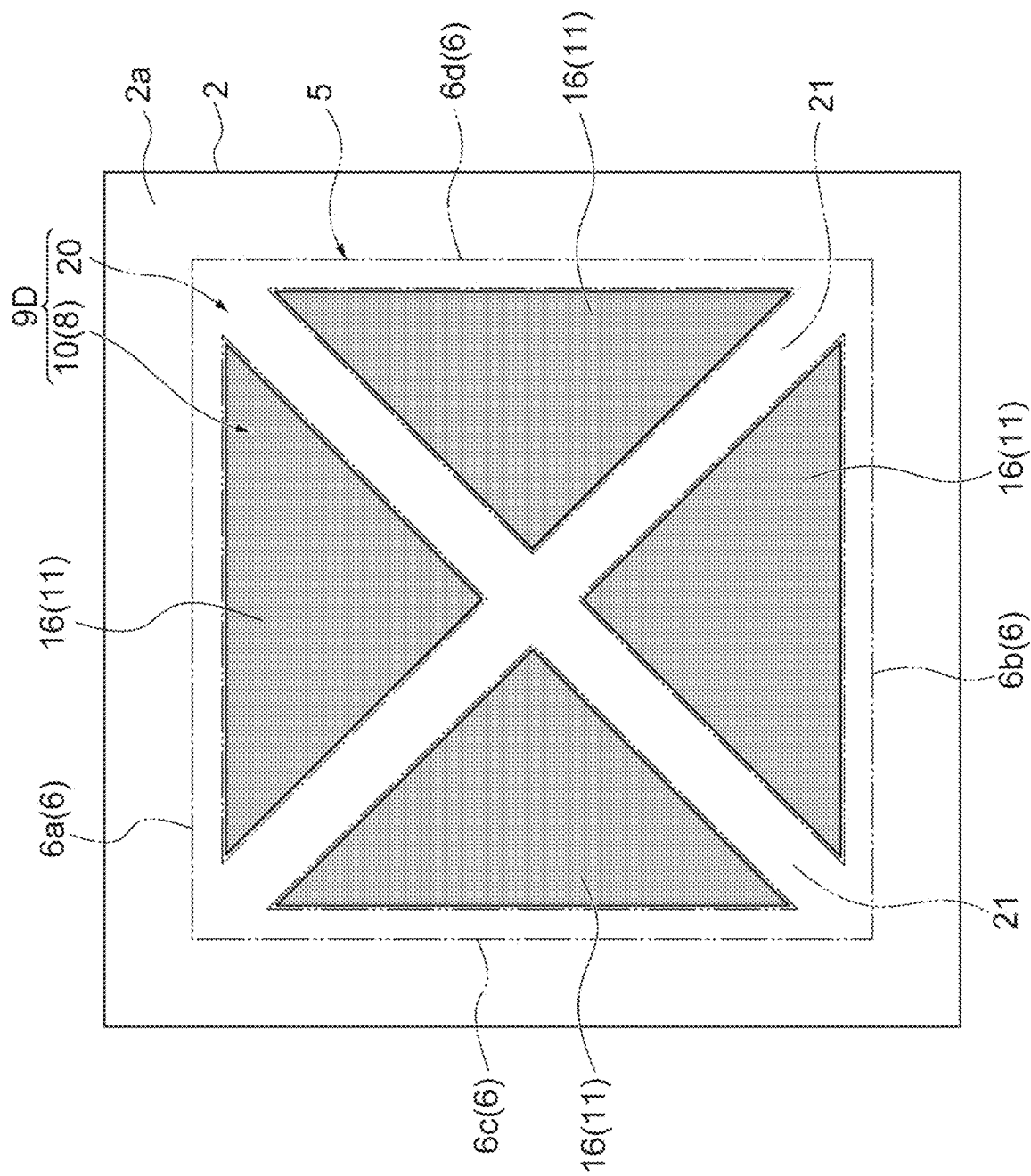
FIG. 8 is a plan view illustrating a print pattern of a fifth embodiment.

Next, a print pattern 9D that is formed in a printing step of a member connection method according to a fifth embodiment will be described with reference to FIG. 8. FIG. 8 is a plan view illustrating the print pattern 9D of the fifth embodiment. In the fifth embodiment, as illustrated in FIG. 8, the division regions 11 include four triangular-shaped regions 16 only. The respective triangular-shaped regions 16 have one apex facing toward the center P of the connection region 5 and spread from the center P toward the marginal part 6 of the connection region 5.

In the present embodiment as well, a coating film non-formed region 20 is provided so as to connect a first point and a second point that are separated apart from each other in the marginal part 6 of the connection region 5, and includes a plurality of line-shaped regions 21 that divide the coating film-formed region 10 into a plurality of regions (in the present embodiment, respective triangular-shaped regions 16). Therefore, when the respective members 2 and 3 are laminated with a coating film 8 interposed therebetween in the lamination step, the line-shaped regions 21 function as release portions that release air out of the connection region 5. Therefore, similarly to the embodiments described above, voids remaining in the interior of the copper sintered compact 4 after sintering, or between the copper sintered compact 4 and the respective members 2 and 3, can be suppressed.

Sixth Embodiment

Figure 9:
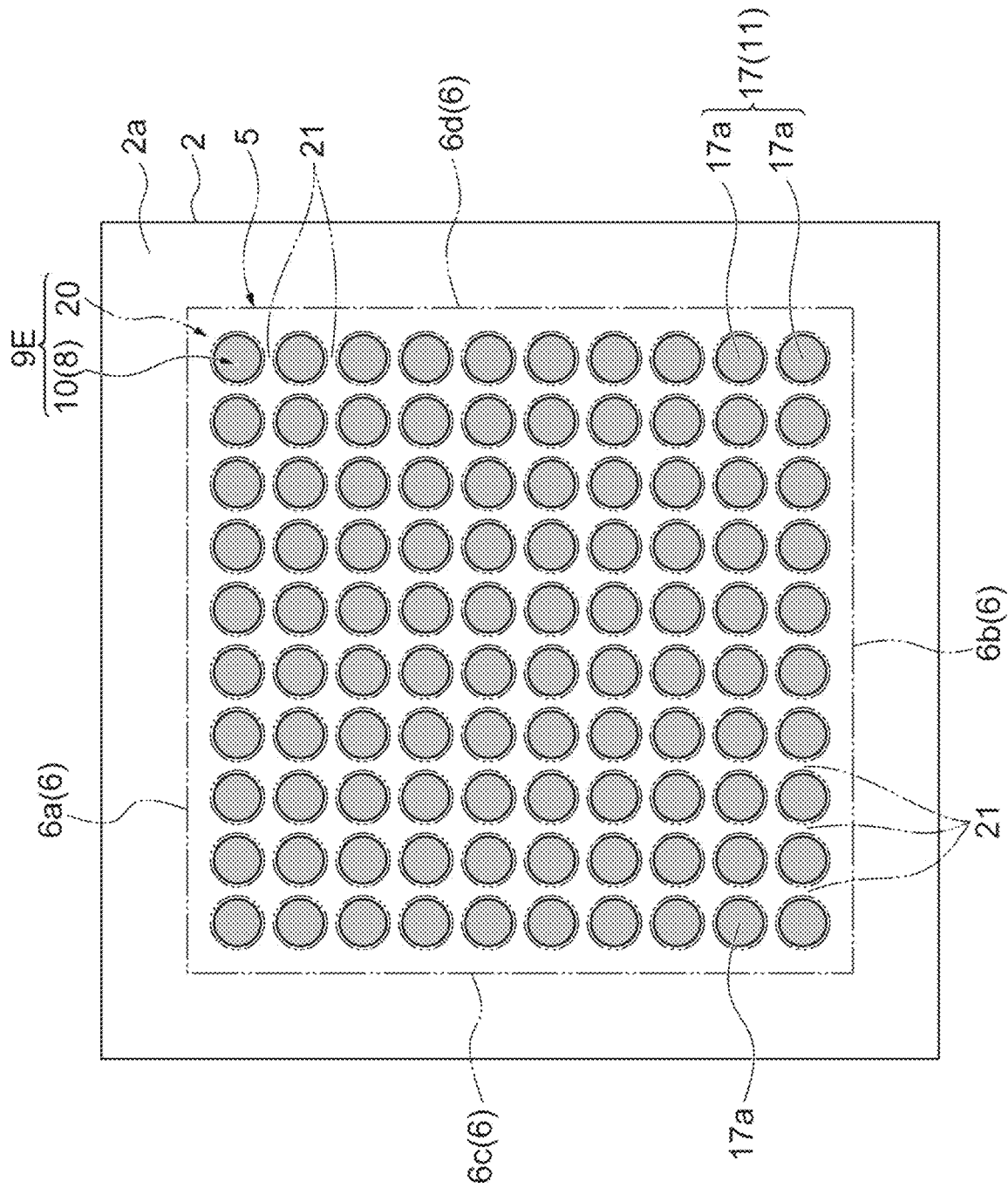
FIG. 9 is a plan view illustrating a print pattern of a sixth embodiment.

Next, a print pattern 9E that is formed in a printing step of a member connection method according to a sixth embodiment will be described with reference to FIG. 9. FIG. 9 is a plan view illustrating the print pattern 9E of the sixth embodiment. In the sixth embodiment, as illustrated in FIG. 9, the division regions 11 include a lattice region 17 only. The lattice region 17 is a region arranged in a lattice form, similarly to the fourth embodiment described above. In the present embodiment, the lattice region 17 includes one hundred circular-shaped regions 17a in total arranged in 10 columns and 10 rows. The inner side of the regions 17a may be embedded with a coating film 8 as illustrated in the diagram, or may be opened without a coating film 8.

In the present embodiment as well, a coating film non-formed region 20 is provided so as to connect a first point and a second point that are separated apart from each other in the marginal part 6 of the connection region 5, and includes a plurality of line-shaped regions 21 that divide the coating film-formed region 10 into a plurality of regions (in the present embodiment, respective regions 17a). Therefore, similarly to the embodiments described above, it is possible to release air efficiently out of the connection region 5 by means of a plurality of the line-shaped regions 21, and a void-suppressing effect can be sufficiently secured.

Seventh Embodiment

Figure 10:
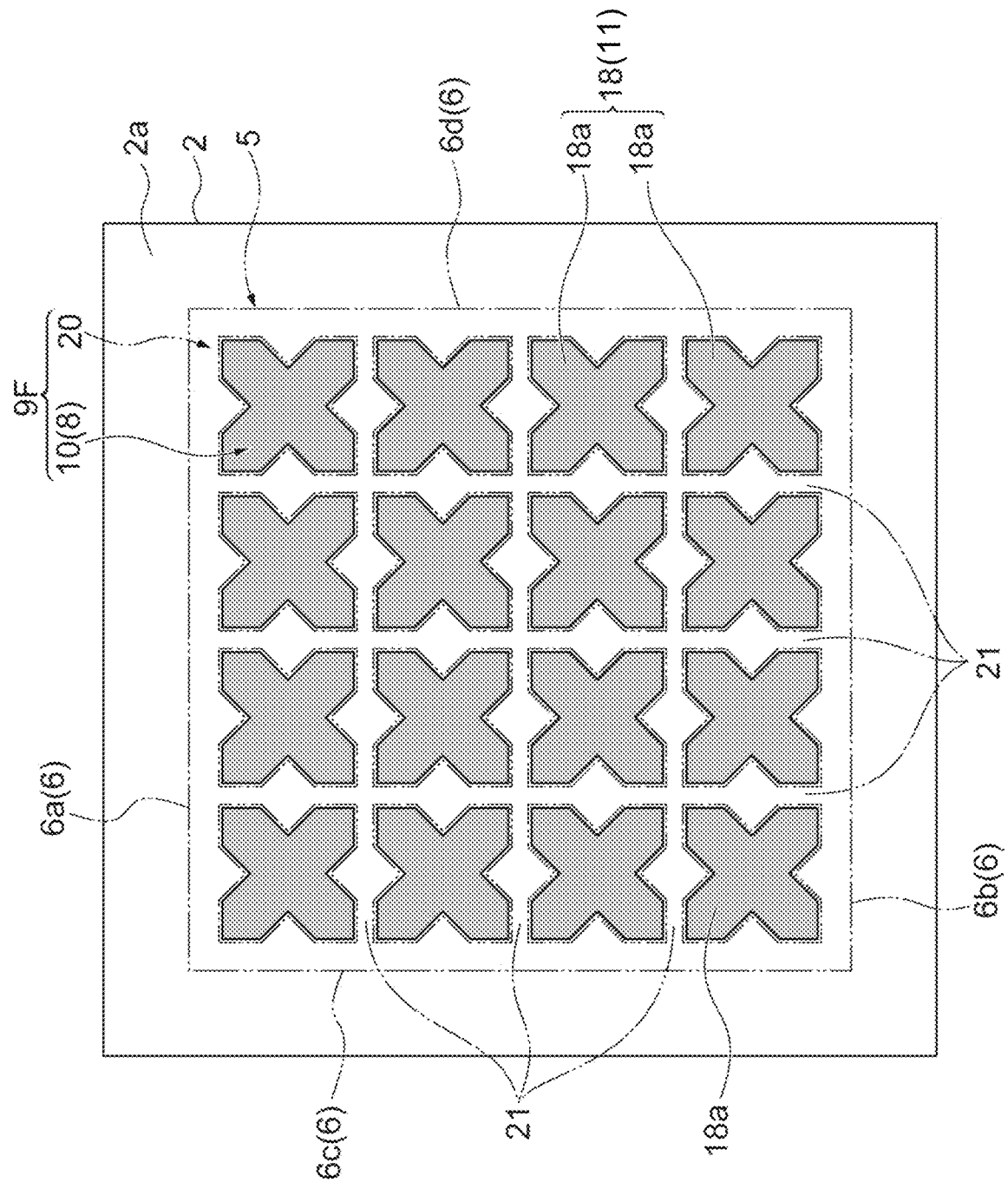
FIG. 10 is a plan view illustrating a print pattern of a seventh embodiment.

Next, a print pattern 9F that is formed in a printing step of a member connection method according to a seventh embodiment will be described with reference to FIG. 10. FIG. 10 is a plan view illustrating the print pattern 9F of the seventh embodiment. In the seventh embodiment, as illustrated in FIG. 10, the division regions 11 include a lattice region 18 only. The lattice region 18 is a region arranged in a lattice form, similarly to the fourth embodiment described above. In the present embodiment, the lattice region 18 includes sixteen cross-shaped regions 18a in total arranged in 4 columns and 4 rows. The inner side of the regions 18a may be embedded with a coating film 8 as illustrated in the diagram, or may be opened without a coating film 8.

In the present embodiment as well, a coating film non-formed region 20 is provided so as to connect a first point and a second point that are separated apart from each other in the marginal part 6 of the connection region 5, and includes a plurality of line-shaped regions 21 that divide the coating film-formed region 10 into a plurality of regions (in the present embodiment, respective regions 18a). Therefore, similarly to the embodiments described above, in the present embodiment as well, it is possible to release air efficiently out of the connection region 5 by means of a plurality of the line-shaped regions 21, and a void-suppressing effect can be sufficiently secured.

Eighth Embodiment

Figure 11:
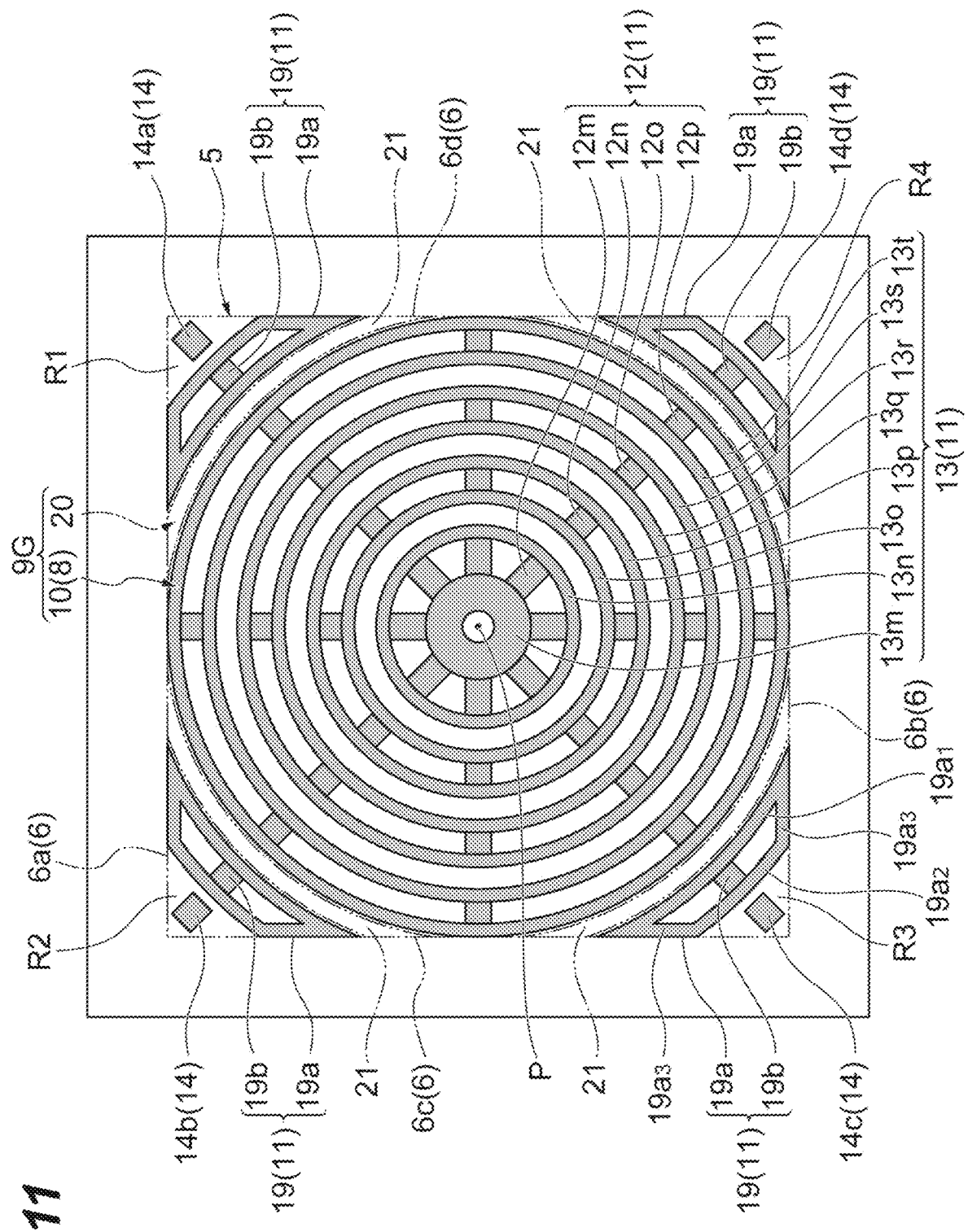
FIG. 11 is a plan view illustrating a print pattern of an eighth embodiment.

Next, a print pattern 9G that is formed in a printing step of a member connection method according to an eighth embodiment will be described with reference to FIG. 11. FIG. 11 is a plan view illustrating the print pattern 9G of the eighth embodiment. In the eighth embodiment, as illustrated in FIG. 11, the coating film-formed region 10 includes division regions 11 and corner regions 14. The division regions 11 include radial regions 12, concentric regions 13, and corner vicinity regions 19.

According to the present embodiment, the radial regions 12 include thirty-two regions 12m, 12n, 12o, and 12p, four of them being disposed along each of eight virtual straight lines extending from the center P in the connection region 5 toward the marginal part 6. That is, the radial regions 12 include four regions 12m to 12p along the same virtual straight line, in proportion to the number of the virtual straight lines (eight groups). The respective regions 12m to 12p along the same virtual straight line are aligned to be separated apart from one another in the diameter direction.

The concentric regions 13 include seven concentric circular-shaped regions 13m, 13n, 13o, 13p, 13q, 13r, 13s, and 13t, which mutually share the center P in the connection region 5, and the distances of which from the center P are mutually different. Region 12m is positioned between the region 13m and the region 13n. The region 13m and the region 13n are connected to each other by means of the region 12m. Region 12n is positioned between the region 13o and the region 13p. The region 13o and the region 13p are connected to each other by means of the region 12n. Region 12o is positioned between the region 13q and the region 13r. The region 13q and the region 13r are connected to each other by means of the region 12o. Region 12p is positioned between the region 13s and the region 13t. The region 13s and the region 13t are connected to each other by means of the region 12p.

The region 13n and the region 13o may be separated apart as illustrated in the diagram, or the space therebetween may be embedded with a coating film 8. The region 13p and the region 13q may be separated apart as illustrated in the diagram, or the space therebetween may be embedded with a coating film 8. The region 13r and the region 13s may be separated apart as illustrated in the diagram, or the space therebetween may be embedded with a coating film 8.

Regarding the corner vicinity regions 19, four are respectively disposed in the vicinity of corresponding corners R1 to R4. The corner vicinity regions 19 are positioned on the side outer to the outermost region 13t (marginal part 6 side) in the concentric regions 13. The respective corner vicinity regions 19 include approximately trapezoidal-shaped opening regions 19a; and inside-opening regions 19b that are disposed inside the opening regions 19a. An opening region 19a includes a circular arc part $19a_1$ that is positioned on the side outer to the region 13t (marginal part 6 side); a circular arc part $19a_2$ that is positioned on the side outer to the circular arc part $19a_1$ (marginal part 6 side) and is shorter than the circular arc part $19a_1$; and a pair of edges 19a3 that extend along the marginal part 6 and connect the circular arc part $19a_1$ and the circular arc part $19a_2$. The circular arc part $19a_1$ and the circular arc part $19a_2$ mutually share the center P, respectively conform to virtual concentric circles whose distances from the center P are mutually different, and are approximately parallel to each other. The opening regions 19a may be opened as illustrated in the diagram or may be embedded with a coating film 8.

The inside-opening regions 19b are disposed on virtual straight lines extending from the center P to corresponding corners R1 to R4 and on the side outer to the outermost region 12p (marginal part 6 side) in the radial regions 12. The inside-opening regions 19b are positioned between the circular arc part $19a_1$ and the circular arc part $19a_2$ and connect the circular arc part $19a_1$ and the circular arc part $19a_2$.

The respective regions 14a to 14d in the corner regions 14 in the present embodiment are positioned on the side outer to the corner vicinity regions 19 (marginal part 6 side). That is, the respective regions 14a to 14d are positioned on virtual straight lines extending from the center P toward corresponding corners R1 to R4, most closely to the marginal part 6.

In the present embodiment, the concentric regions 13 include seven concentric circular-shaped regions 13m to 13t, and the respective regions 12m to 12p are positioned in the radial regions 12 so as to embed the space between the region 13m and the region 13n, the space between the region 13o and the region 13p, the space between the region 13q and the region 13r, and the space between the region 13s and the region 13t, with a coating film 8. The corner vicinity regions 19 are positioned so as to embed the side outer to the outermost region 13t in the concentric regions 13 with a coating film 8. In the corner vicinity regions 19, the inside-opening regions 19b are positioned so as to embed the opening regions 19a with the coating film 8. The corner regions 14 are positioned so as to embed the side outer to the corner vicinity regions 19 with the coating film 8. Therefore, as the respective regions 12m to 12p, 13m to 13t, 19a and 19b, and 14a to 14d expand due to the respective own weights of the members 2 and 3, application of pressing pressure, or the like during the lamination step, the respective regions 12m to 12p, 13m to 13t, 19a and 19b, and 14a to 14d are easily connected, and the coating film non-formed region 20 reliably ceases to exist.

According to the present embodiment, the line-shaped regions 21 are formed between the region 13t and the circular arc part $19a_1$ of the opening region 19a. That is, the coating film non-formed region 20 includes four line-shaped regions 21 that divide the region 13t and the circular arc part $19a_1$ of the opening region 19a. Therefore, when the respective members 2 and 3 are laminated with a coating film 8 interposed therebetween in the lamination step, the line-shaped regions 21 function as release portions that release air out of the connection region 5. Therefore, similarly to the embodiments described above, voids remaining in the interior of the copper sintered compact 4 after sintering, or between the copper sintered compact 4 and the respective members 2 and 3, can be suppressed.

Thus, various embodiments of the present embodiment have been described; however, the present invention is not intended to be limited to the above-described embodiments, and embodiments that have been modified to the extent that the gist described in the respective claims is maintained, or embodiments that have been applied to others are also acceptable.

For example, the respective regions 12a to 12c along the same virtual straight line, and the respective regions 12d to 12h along the same virtual straight line may not be aligned to be separated apart from one another in the diameter direction, or may be connected to one another in the diameter direction and extend continuously. Furthermore, the respective regions 13a along the same virtual concentric circle, the respective regions 13b along the same virtual polygon, and the respective regions 13c to 13f along the same virtual concentric circle may not be aligned to be separated apart from one another in the circumferential direction, or may be connected to one another in the circumferential direction and extend continuously.

Between the respective regions 13a and the respective regions 13b that are adjacent to one another in the diameter direction, without being limited to one region 12c, a plurality of regions 12c may be positioned.

A plurality of regions 12b and 12c, regions 12d to 12h, regions 13a and 13b, and regions 13c to 13f that are included in the division regions 11 may not have larger areas as the regions are disposed at positions closer to the marginal part 6 of the connection region 5.

According to the first and eighth embodiments, the coating film-formed region 10 may not include corner regions 14, and according to the second to seventh embodiments, the coating film-formed region 10 may include corner regions 14.

In the embodiments described above, examples in which the coating film-formed region 10 is divided into a plurality of regions by means of a plurality of line-shaped regions 21; however, it is acceptable that there is at least one of the line-shaped regions 21, and the coating film-formed region 10 may be divided into two regions by one line-shaped region 21.

According to the fifth embodiment, an example in which the respective triangular-shaped regions 16 are regions forming the coating film 8 has been described; however, it is also acceptable that the coating film 8 is not formed in the respective triangular-shaped regions 16, and the coating film 8 is formed in the region between the respective triangular-shaped regions 16. That is, the coating film-formed region 10 where the coating film 8 is formed may show the shape of letter X.

In the above-described embodiments, examples in which the columns and rows in the lattice regions 15, 17, and 18 are arranged to line up have been described; however, the columns or rows in the lattice regions 15, 17, and 18 may be shifted and alternately arranged.

REFERENCE SIGNS LIST 2, 3: member, 4: copper sintered compact, 5: connection region, 6: marginal part, 8: coating film, 9, 9A to 9G: print pattern, 10: coating film-formed region, 11: division region, 12: radial region, 12a to 12h, 12m to 12p: region, 13: concentric region, 13a to 13f, 13m to 13t: region, 14: corner region, 14a to 14d: region, 15, 17, 18: lattice region, 15a, 17a, 18a: region, 16: triangular-shaped region, 19: corner vicinity region, 19a: opening region, 19b: inside-opening region, 20: coating film non-formed region, 21, 21a to 21c: line-shaped region, A, B, C, D: point, R1 to R4: corner.

The invention claimed is:

1. A member connection method for connecting a first member and a second member by means of a copper sintered compact,
the member connection method comprising:
a printing step of forming a coating film of a copper paste for connection in a connection region between the first member and the second member into a predetermined print pattern;
a lamination step of laminating the first member and the second member with the coating film interposed therebetween; and a sintering step of sintering the coating film to form the copper sintered compact and connecting the first member and the second member by means of this copper sintered compact, wherein in the printing step, a coating film-formed region in which the coating film is formed, and a coating film non-formed region in which the coating film is not formed are formed in the print pattern, the coating film-formed region is divided into a plurality of regions by means of one or a plurality of the coating film non-formed regions provided so as to connect a first point and a second point, which are separated apart from each other in a marginal part of the connection region, a plurality of the regions in the coating film-formed region includes both regions that are arranged radially from a central part of the connection region toward the marginal part, and regions that are arranged concentrically around the central part of the connection region, a plurality of the regions in the coating film-formed region includes portions in which the regions that are arranged radially and the regions that are arranged concentrically are alternately disposed radially from the central part of the connection region toward the marginal part, each of the plurality of radial regions has a plurality of divided regions separated apart from one another along a radial line, each of the plurality of concentric regions has a plurality of divided regions separated apart from one another along a line of a concentric circle form or a concentric polygon form, at least a part of the plurality of divided regions in the plurality of radial regions is disposed between and spaced apart from the plurality of divided regions in the plurality of concentric regions in a radial direction, and a length in a generally circumferential direction around the central part of the connection region of each of the plurality of divided regions in the plurality of radial regions is shorter than a length in a generally circumferential direction around the central part of the connection region of each of the plurality of divided regions in the plurality of concentric regions between which the plurality of divided regions in the plurality of radial regions are disposed in the radial direction.

2. The member connection method according to claim 1, wherein the connection region has a plurality of edges, and the coating film non-formed region is provided so as to connect the first point and the second point, which are positioned at edges that are different from each other.

3. The member connection method according to claim 1, wherein the connection region is a rectangular-shaped region, and the coating film-formed region includes regions disposed correspondingly to the corners of the connection region.

4. The member connection method according to claim 1, wherein a plurality of the regions in the coating film-formed region has larger areas as the regions are disposed at positions closer to the marginal part of the connection region.

5. The member connection method according to claim 1, wherein at least one of the first member and the second member is a semiconductor element.

* * * * *